United States Patent
Onozuka et al.

(10) Patent No.: US 7,180,237 B2
(45) Date of Patent: Feb. 20, 2007

(54) ACTIVE MATRIX SUBSTRATE, FREE OF A SPACER LAYER IN A PIXEL REGION

(75) Inventors: Yutaka Onozuka, Yokohama (JP); Masahiko Akiyama, Tokyo (JP); Yujiro Hara, Yokohama (JP); Kentaro Miura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/947,291

(22) Filed: Sep. 23, 2004

(65) Prior Publication Data

US 2005/0106768 A1    May 19, 2005

(30) Foreign Application Priority Data

Sep. 25, 2003  (JP) .............. 2003-332815

(51) Int. Cl.
*H01J 19/42* (2006.01)
(52) U.S. Cl. ............ 313/500; 313/258; 313/238; 438/30
(58) Field of Classification Search ......... 313/500
See application file for complete search history.

(56) References Cited

U.S. PATENT DOCUMENTS

| | | | |
|---|---|---|---|
| 5,978,061 A * | 11/1999 | Miyazaki et al. ......... 349/155 |
| 6,559,905 B1 | 5/2003 | Akiyama ............... 349/45 |
| 6,593,992 B1 * | 7/2003 | Chin et al. ............. 349/153 |
| 6,724,458 B2 * | 4/2004 | Kim et al. ............. 349/156 |
| 2001/0052959 A1 * | 12/2001 | Tamatani et al. ........ 349/153 |
| 2005/0106768 A1 | 5/2005 | Onozuka et al. |
| 2005/0243229 A1 | 11/2005 | Akiyama et al. |

FOREIGN PATENT DOCUMENTS

| | | |
|---|---|---|
| JP | 6-118441 | 4/1994 |
| JP | 11-142878 | 5/1999 |
| JP | 2001-7340 | 1/2001 |
| JP | 2003-289136 | 10/2003 |

OTHER PUBLICATIONS

U.S. Appl. No. 11/179,525, filed Jul. 13, 2005, Akiyama et al.

* cited by examiner

*Primary Examiner*—Sikha Roy
(74) *Attorney, Agent, or Firm*—Oblon, Spivak, McClelland, Maier & Neustadt, P.C.

(57) ABSTRACT

In an active matrix substrate, the substrate includes a pixel region and a peripheral region surrounding the pixel region. A plurality of adhesive layers arranged to form a matrix having rows and columns are arranged in the pixel region, and pluralities of active elements are formed, respectively, on the plural adhesive layers. A spacer layer is formed in the peripheral region, and a uniform pressure is applied between the active element and the adhesive layer in performing the transfer.

8 Claims, 13 Drawing Sheets

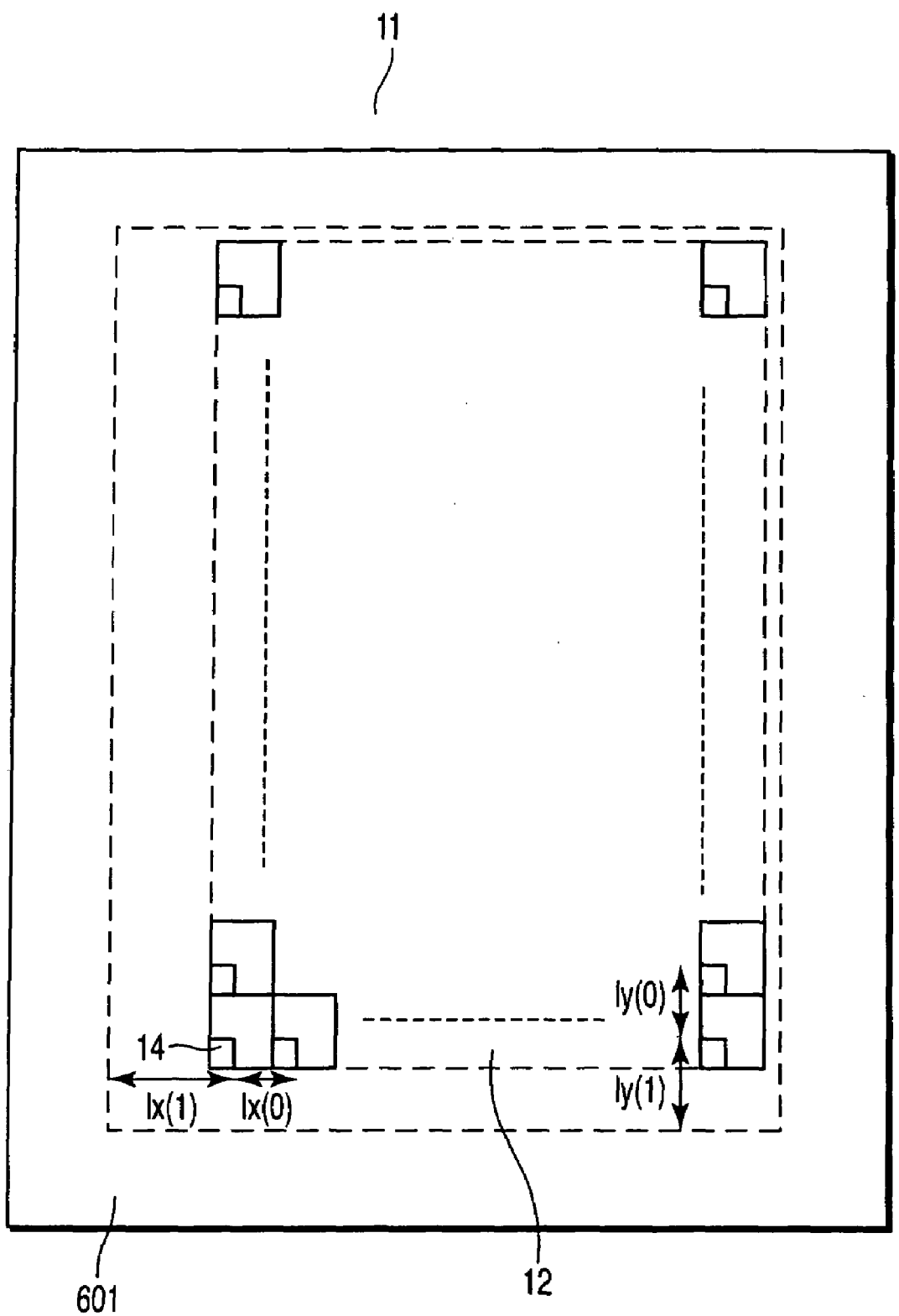
F I G. 16

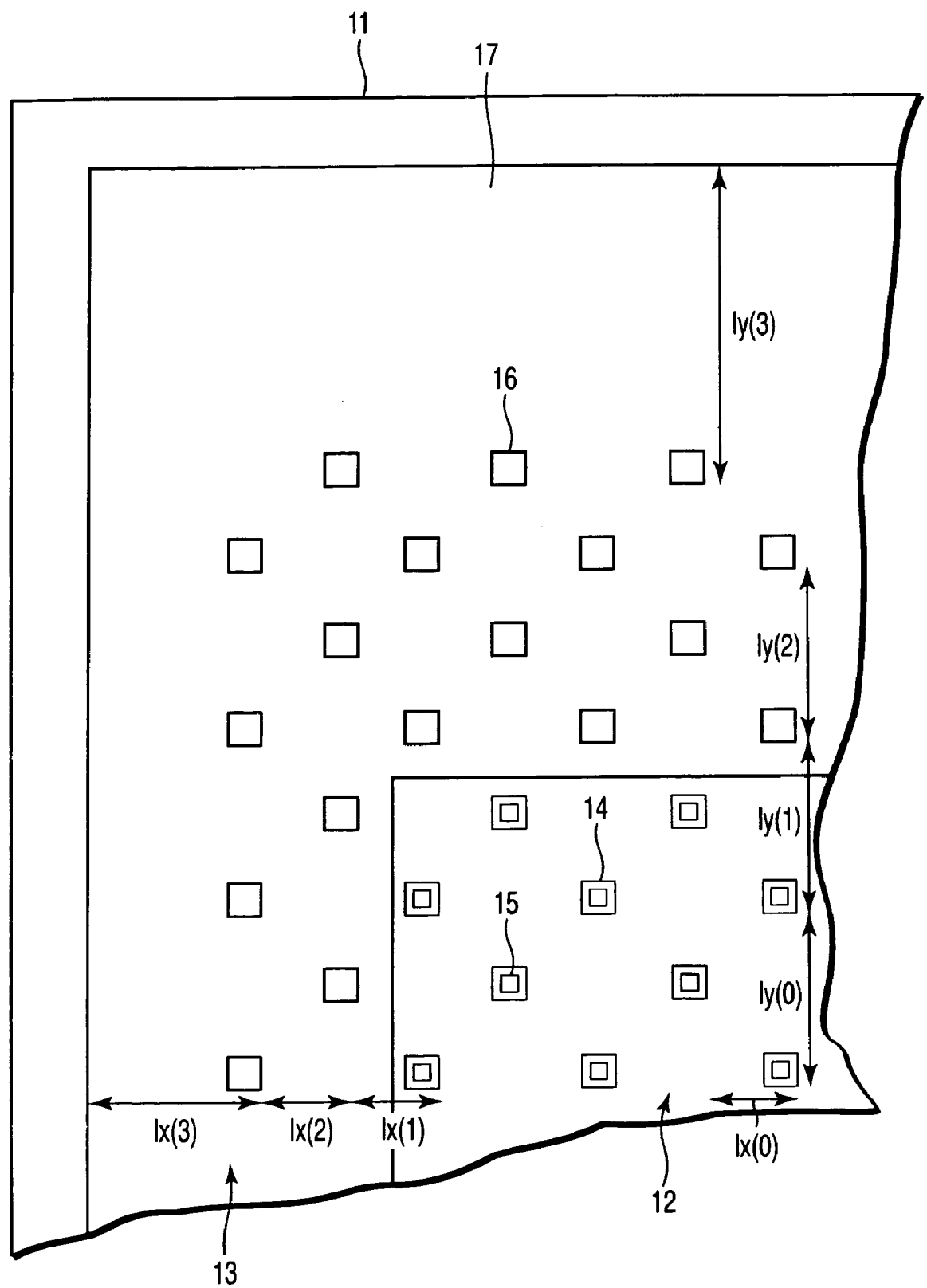
F I G. 18

ACTIVE MATRIX SUBSTRATE, FREE OF A SPACER LAYER IN A PIXEL REGION

CROSS-REFERENCE TO RELATED APPLICATIONS

This application is based upon and claims the benefit of priority from prior Japanese Patent Application No. 2003-332815, filed Sep. 25, 2003, the entire contents of which are incorporated herein by reference.

BACKGROUND OF THE INVENTION

1. Field of the Invention

The present invention relates to an active matrix substrate, a method manufacturing an active matrix substrate, and an intermediate transfer substrate for manufacturing an active matrix substrate.

2. Description of the Related Art

An active matrix type display device having active elements arranged on matrix-like pixels permits realizing a planar type display device of a high image quality. Particularly, a liquid crystal display device (LCD), in which a liquid crystal is used as an optical shutter and each pixel is driven by an active element such as a TFT, is widely used in various devices such as a PC monitor and a television receiver for a video display.

Also, an organic EL display device that permits displaying a full color image on a thin panel has been developed. In the organic EL display device, the organic EL materials that emit light rays of red, green and blue are formed into pixels by an ink jet method or a mask vapor deposition method, and each pixel thus formed is driven by an active element such as a thin film transistor (TFT).

In almost all the types of the display device, the active element is formed on a glass substrate. However, the glass substrate tends to be cracked and is heavy. Also, the display device having a glass substrate incorporated therein tends to be broken and is heavy. Such being the situation, it is desirable to develop a tough and lightweight display device. It is also desirable to develop a flexible display device that can be bent or folded freely.

Under the circumstances, a display device comprising a flexible substrate excellent in the impact resistance and light in weight such as a plastic substrate attracts attentions as a display device satisfying the requirements given above. In the display device of the particular type, it is necessary for an active element such as a thin film transistor (TFT) to be formed on the plastic substrate. Presently, amorphous silicon or polycrystalline silicon (polysilicon) is widely used for forming the thin film transistor. What should be noted is that it is absolutely necessary to employ a high temperature process of about 350° C. to 600° C. for forming the thin film transistor. On the other hand, the plastic substrate is resistant to heat of only up to about 200° C. It follows that it is difficult to form the thin film transistor directly on the plastic substrate.

As a method for overcoming the difficulty described above, proposed is a method of using an element formation substrate and a final substrate in place of the method of forming an active element directly on the plastic substrate. To be more specific, the element formation substrate is formed of a glass substrate having thin film transistors formed thereon at a high density so as to form a thin film transistor array. On the other hand, pluralities of plastic substrates are used as the final substrates. Of course, the thin film transistor array is transferred from the element formation substrate onto the plastic substrates used as the final substrates. The particular method is disclosed in, for example, Japanese Patent Disclosure (Kokai) No. 6-118441, Japanese Patent Disclosure No. 11-142878 and Japanese Patent Disclosure No. 2001-7340. In this method, the thin film transistor equivalent in characteristics to the conventional thin film transistor can be formed on the plastic substrate because the thin film transistor can be formed at the temperature substantially equal to that for forming the conventional thin film transistor. It should also be noted that the transfer cost can be lowered because the thin film transistor array can be transferred from a single element formation substrate onto a plurality of final substrates.

In the conventional method, however, it is possible for even the element that should not be transferred to be transferred from the element formation substrate onto the final substrates so as to give rise to the problem that the transfer selectivity is lowered.

BRIEF SUMMARY OF THE INVENTION

An object of the present invention is to provide a method of manufacturing an active matrix substrate having high transfer selectivity, an active matrix substrate manufactured by the particular manufacturing method, and an intermediate transfer substrate used in the method of manufacturing the active matrix substrate.

According to an aspect of the present invention, there is provided an active matrix substrate, comprising:

a substrate having a pixel region and a peripheral region surrounding the pixel region;

a plurality of adhesive layers arranged in a matrix having rows and columns in the pixel region;

a plurality of active elements formed on the adhesive layers, respectively; and a spacer layer formed in the peripheral region.

According to another aspect of the present invention, there is provided a method of manufacturing an active matrix substrate, comprising:

forming active elements on an element formation substrate;

bonding the active elements formed on the element formation substrate to an intermediate transfer substrate;

removing the element formation substrate bonded to the intermediate transfer substrate with the active elements interposed therebetween;

forming adhesive layers in a pixel region of a final substrate having the pixel region and a peripheral region surrounding the pixel region;

forming a spacer layer in the peripheral region of the final substrate;

transferring the active elements bonded to the intermediate transfer substrate to the adhesive layer of the final substrate;

forming wirings on the final substrate; and connecting the active elements on the final substrate to the wirings.

According to another aspect of the present invention, there is provided a method of manufacturing an active matrix substrate, comprising:

forming active elements on a element formation substrate;

preparing an intermediate transfer substrate having a first pixel region and a first peripheral region surrounding the first pixel region;

bonding the active elements on the element formation substrate to the first pixel region;

forming a spacer layer in the first peripheral region;

removing the element formation substrate bonded to the intermediate transfer substrate with the active element interposed therebetween;

preparing a final substrate having a second pixel region and a second peripheral region surrounding the second pixel region;

forming an adhesive layer in the second pixel region;

transferring the active elements bonded to the intermediate transfer substrate to the adhesive layer on the final substrate;

forming wirings on the final substrate; and connecting the active elements on the final substrate to the wirings.

Further, according to still another aspect of the present invention, there is provided an intermediate transfer substrate, comprising:

a substrate having an element region and a peripheral region surrounding the element region;

a peeling layer formed on the substrate;

a plurality of active elements formed apart from each other on the peeling layer on the element region; and a spacer layer formed in the peripheral region on the substrate.

BRIEF DESCRIPTION OF THE SEVERAL VIEWS OF THE DRAWING

FIG. 16 is a plan view schematically showing the positional relationship between a provisional adhesive layer and a spacer layer in the active matrix substrate according to another modification of the present invention;

FIG. 18 is a plan view schematically showing the positional relationship between a provisional adhesive layer and a spacer layer in the active matrix substrate according to another modification of the present invention;

DETAILED DESCRIPTION OF THE INVENTION

Figure 1:
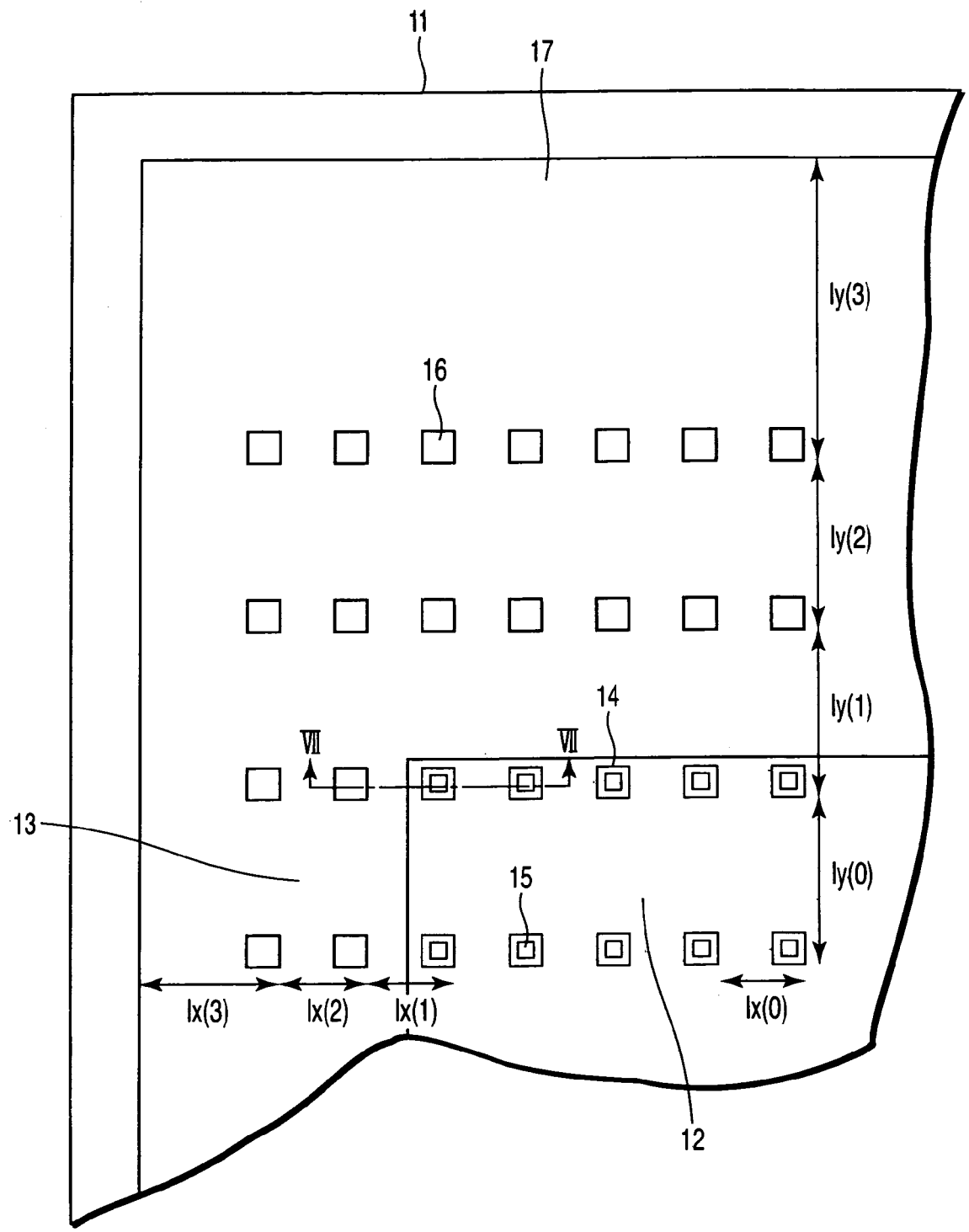
FIG. 1 is a plan view schematically showing the construction of an active matrix substrate according to a first embodiment of the present invention.

An active matrix substrate according to an embodiment of the present invention and a method of manufacturing the same will now be described with reference to the accompanying drawings.

Before describing the active matrix substrate of the present invention, the situation under which the present inventors have arrived at the present invention will now be described briefly.

In the manufacture of an active matrix substrate, an active element is formed first on a element form ation substrate, followed by transferring the active element from the element formation substrate onto an intermediate transfer substrate and subsequently transferring selectively the active element from the intermediate transfer substrate onto a final substrate. The present inventors have looked into the selectivity of the transfer in selectively transferring the active element in the process of manufacturing the active matrix substrate.

It has been clarified that, in the final substrate, the transfer selectivity is high in the region into which the active element is to be transferred and in the region in which the pixel electrode is to be formed, particularly, in the region including the central portion of the pixel region. On the other hand, it has been clarified that, in the final substrate, the transfer selectivity within the pixel region is lowered as the transfer region approaches the peripheral region onto which the active element is not transferred from the central portion of the pixel region, the peripheral region being formed to surround the pixel region. Particularly, it has been clarified that a first type defective transfer is generated more frequently than a second type defective transfer, as the transfer region approaches the peripheral region in the final substrate, compared with the case where the transfer region is in the central region of the pixel region. Incidentally, the first type defective transfer noted above denotes that the active element that should not be transferred is transferred. On the other hand, the second type defective transfer denotes that the active element that should be transferred is not transferred. It is considered reasonable to understand that the defective transfer is generated because an adhesive layer for bonding the active element is not included in the peripheral region of the final substrate and, thus, the spacer effect produced by the adhesive layer is lowered. In other words, when the active element is transferred from the intermediate transfer substrate onto the final substrate, the pressure for pushing the active element against the intermediate transfer substrate is applied more strongly to the active element in the peripheral region than in the pixel region of the final substrate. It follows that the active element on the intermediate transfer substrate is brought into contact more easily with the final substrate, with the result that the unselected active element in the pixel region or the active element in the peripheral region of the intermediate transfer substrate is also transferred onto the final substrate. Such being the situation, the yield in the manufacture of the active matrix substrate is lowered so as to increase the manufacturing cost.

Under the circumstances, in the manufacturing process of the active matrix substrate according to the present invention, a space layer is formed in the peripheral region of the intermediate transfer substrate or in the peripheral region of the final substrate so as to permit a substantially uniform pressure to be applied to the active element. In this fashion, it is possible in the present invention to prevent the defective transfer that the active element that should not be transferred is transferred.

The active matrix substrate according to a first embodiment of the present invention will now be described with reference to FIG. 1. The active matrix substrate shown in FIG. 1 corresponds to a final substrate 11. As shown in the drawing, a spacer layer 16 is formed in a peripheral region 13 of the substrate 11.

The active matrix substrate, i.e., final substrate) 11 has a surface that is partitioned into a pixel region 12 including the central portion of the substrate 11 and expanded to cover the periphery of the central region, and the peripheral region 13 formed to surround the pixel region 12. A plurality of adhesive layers 14 are arranged to form a matrix in the pixel region 12 on the active matrix substrate 11, and an active element 15 is formed on each of the adhesive layers 14. Also, the spacer layers 16 are formed in the peripheral region 13 on the active matrix substrate 11 such that the adhesive layers 14 and the spacer layers 16 are arranged to form a matrix including a plurality of rows and a plurality of columns on the active matrix substrate 11. The adhesive layers 14 are sized substantially equal to or slightly larger than the active elements 15, and the spacers 16 are sized substantially equal to the adhesive layers 14.

As described above, the spacer layers 16 are formed in the present invention in the peripheral region 13 on the active matrix substrate 11 so as to prevent the defective transfer that the active element 15 is transferred onto a non-transfer section. To be more specific, in the process of allowing an intermediate transfer substrate (not shown), which is described herein later, to be pushed against the active matrix substrate 11 for transferring the active element 15 onto the active matrix substrate 11, the spacer layers 16 permit the pressure substantially equal to the pressure applied to the central portion of the pixel region 2 to be applied between the active matrix substrate 11 and the intermediate transfer substrate even in the edge portion of the pixel region 12.

It should also be noted that, in the active matrix substrate 11 shown in FIG. 1, the pitches in the X- and Y-directions of the adhesive layers 14, the pitches in the X- and Y-directions of the spacer layers 16, and the distance between the adhesive layer 14 and the spacer layer 16 are defined to be $1x(0)=1x(1)=1x(2)$ and $1y(0)=1y(1)=1y(2)$, where $1x(0)$ and $1y(0)$ denote the pitches of the adhesive layers 14 in the pixel region 12 in the X-direction (row direction) and the Y-direction (column direction), respectively, $1x(2)$ and $1y(2)$ denote the pitches of the spacer layers 16 in the peripheral region 13 in the X- and Y-directions, respectively, and the $1x(1)$ and $1y(1)$ denote the distances between the adhesive layer 14 and the spacer layer 16 in the X- and Y-directions, respectively. In other words, the adhesive layers 14 and the spacer layers 16 are arranged in the same period in the pixel region 12 and the peripheral region 13. Where the adhesive layers 14 and the spacer layers 16 are arranged at the same pitch as pointed out above, it is possible to allow the pressures applied to the pixel region 12 and the peripheral region 13 to be substantially equal to each other. Also, in the particular arrangement, the spacer layers 16 can be formed simultaneously with formation of, for example, the adhesive layers 14.

Concerning the spacer pitch, it suffices for the conditions of $1x(2) \leqq 1x(0)$ and $1y(2) \leqq 1y(0)$ to be satisfied even if the adhesive layers 14 and the spacer layers 16 are not arranged at the same pitch. If the conditions given above are satisfied, it is possible for the active elements 15 to be transferred successively in any order.

As shown in FIG. 1, a provisional adhesive layer for allowing the active matrix substrate 11 to be provisionally bonded to an intermediate transfer substrate (not shown) is formed in the intermediate transfer substrate in the range denoted by a reference numeral 17. It is desirable for the distance $1y(3)$ between the inner peripheral edge of the range 17 of the provisional adhesive layer and the edge of the spacer layer 16 to be set larger than the pitch $1y(0)$ of the adhesive layers 14 in the Y-direction. If the distance $1y(3)$ is set larger than the pitch $1y(0)$, the spacer layer 16 is brought into contact with the provisional adhesive layer 17 when the active elements 15 are repeatedly transferred successively. As a result, the effect produced by the spacer layers 16 for allowing the distribution of the applied pressure to be uniform without fail is increased so as to prevent the defective transfer of the active elements 15.

The manufacturing method of a liquid crystal display device comprising the active matrix substrate shown in FIG. 1 will now be described with reference to FIGS. 2 to 11.

Figure 2:
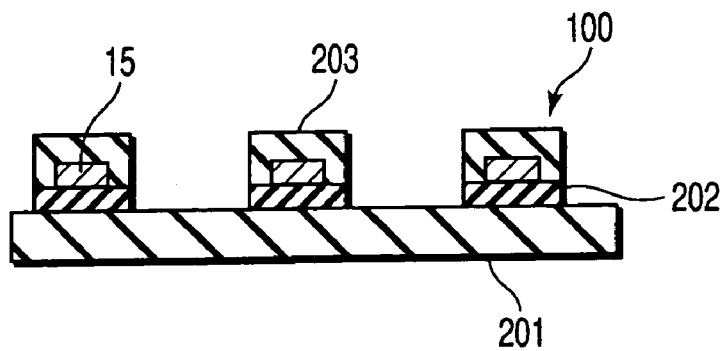
FIG. 2 is a cross sectional view for describing the manufacturing method of the active matrix substrate shown in FIG. 1.

In the first step, prepared is an element formation substrate 201 formed of a glass substrate having a high resistance to heat. An undercoat layer 202 made of, for example, a $SiO_x$ film or a $SiN_x$ film is formed on the element formation substrate 201 in a thickness of about 200 nm to 1 μm. Then, the undercoat layer 202 is selectively removed so as to form a plurality of undercoat layers 202 in the form of islands on the element formation substrate 201 as shown in FIG. 2. A thin film transistor 15 is formed on the surface of each of the island-like undercoat layers 202. Further, a protective layer 203 made of, for example, a photosensitive polyimide resin is formed to cover the thin film transistor 15 and the undercoat layer 202. Similarly, the protective layer 203 is selectively removed such that the thin film transistor 15 is covered with the undercoat layer 202 and the protective film 203. In this fashion, the thin film transistor 15 is left on the undercoat layer 202.

Incidentally, the thin film transistor 15 will be described later in detail. In the following description, the combination of the thin film transistor 15, the undercoat layer 202 and the protective film 203 is called an active element 100.

Figure 3:
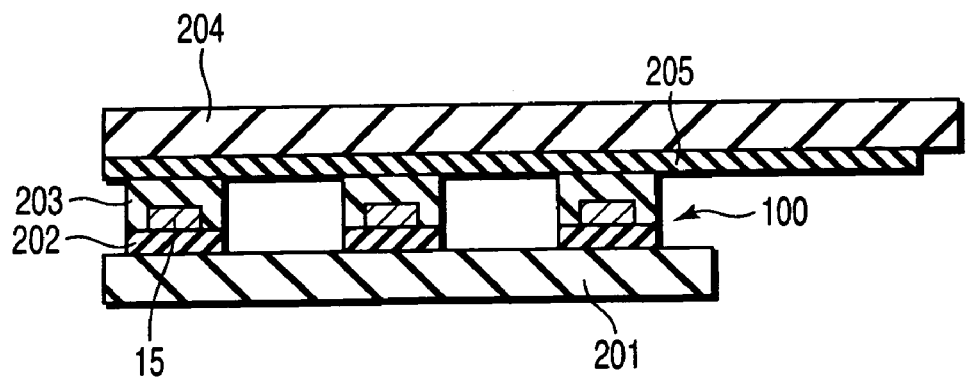
FIG. 3 is a cross sectional view for describing the manufacturing method of the active matrix substrate shown in FIG. 1.

In the next step, prepared is an intermediate transfer substrate 204 onto which all the active elements 100 formed on the element formation substrate 201 are temporarily transferred, as shown in FIG. 3. A peeling layer 205 is formed on the intermediate transfer substrate 204. The peeling layer 205 is formed of a UV peeling resin that is peeled upon irradiation with an ultraviolet light, "Livaalpha" (trade name of a resin manufactured by Nitto Denko K.K., which is foamed upon heating so as to lower the adhesivity), or "Intellimer" (trade name of a resin manufactured by K.K. Nitta, the adhesion of which is changed by utilizing the phase transfer phenomenon in the non-crystalline state). By the adhesion of the peeling layer 205, the protective layer 203 wrapping the active element 100 on the element formation substrate 201 is bonded to the intermediate transfer substrate 204.

Figure 4:
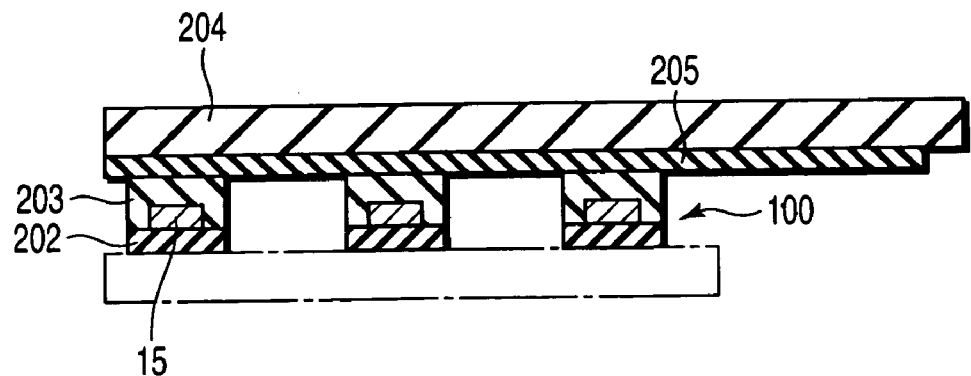
FIG. 4 is a cross sectional view for describing the manufacturing method of the active matrix substrate shown in FIG. 1.

In the next step, the element formation substrate 201 is removed as denoted by a dotted line in FIG. 4. For removing the element formation substrate 201, it is possible to employ a wet etching method that uses a chemical material such as hydrofluoric acid. It is also possible to employ a chemical mechanical polishing method in which the element formation substrate 201 is mechanically polished while dipping the substrate 201 in a chemical solution. Also, in place of removing the element formation substrate 201 itself, it is possible to form, for example, a hydrogenated amorphous silicon layer between the undercoat layer 202 and the element formation substrate 201. In this case, the amorphous silicon layer is abraded by means of a laser beam irradiation so as to peel the element formation substrate 201 while leaving the active element 100 etc. unremoved on the side of the intermediate transfer substrate 204. By this process, the active elements 100 are independently bonded provisionally to the intermediate transfer substrate 204.

Figure 5:
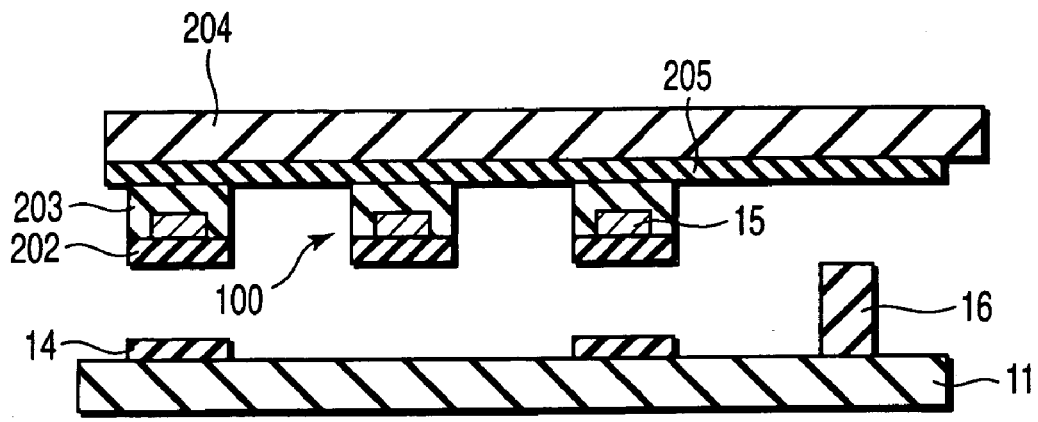
FIG. 5 is a cross sectional view for describing the manufacturing method of the active matrix substrate shown in FIG. 1.

Further, as shown in FIG. 5, prepared is a final substrate 11 onto which the active elements 100 are selectively transferred from the intermediate transfer substrate 204 to which the active elements 100 are bonded provisionally. It is possible for the final substrate 11 to be formed of a plastic substrate made of, for example, polyether ether ketone (PEEK), polyethylene naphthalate (PEN), polyether sulfone (PES) or polyimide (PI). It is also possible to use a flexible substrate as the final substrate 11. In the case of using a flexible substrate, it is possible to achieve a display device that can be bent or folded like a paper sheet. Further, it is apparently possible to use a substrate that is not flexible such as a glass substrate or a silicon substrate as the final substrate 11.

The spacer layers 16 are formed by using an acrylic resin in a thickness of 0.5 µm to 10 µm in the peripheral region on the final substrate 11. Also, the adhesive layers 14 are formed by using an acrylic resin in a thickness of about 1 µm to 5 µm in that region on the final substrate 11 into which the active elements are to be transferred. Incidentally, in this embodiment, the adhesive layers 14 and the spacer layers 16 are arranged in the planar pattern shown in FIG. 1.

It is possible for the spacer layer 16 to be formed of an organic resin such as an acrylic resin or a polyimide series resin or an inorganic material such as $SiO_x$. The acrylic resin is excellent in adhesivity, transparent, excellent in flexibility, and is unlikely to be cracked. Therefore, it is particularly desirable to use the acrylic resin for forming the spacer layer 16. In the case of using a photosensitive organic resin for forming the spacer layer 16, the spacer layer 16 can be patterned easily so as to make it possible to lower the manufacturing cost, compared with the use of a resin that is not photosensitive. Of course, the spacer layer 16 can be patterned by means of etching or printing even if the spacer layer 16 is formed of a resin that is not photosensitive.

Suppose N×M active elements 100 are arranged at a high density on the element formation substrate 201, all of these active elements 100 are transferred in the same pattern onto the intermediate transfer substrate 204, and the active elements 100 on the intermediate transfer substrate 204 are transferred onto a single final substrate 11 such that all the active elements 100 are distributed on four final substrates 11. Since the active elements on the element formation substrate 201 and the intermediate transfer substrate 204 are distributed onto the four final substrate 11, N/2×M/2 active elements 100 are selectively transferred from the intermediate transfer substrate 204 onto each of the four final substrates 11.

The adhesive layer 14 performs the function of selectively transferring the active elements 100 from the intermediate transfer substrate 204 onto the final substrate 11. To be more specific, since the adhesive layers 14 are arranged at a prescribed arranging pattern on the final substrate 11, the active elements 100 provisionally bonded to the intermediate transfer substrate 204 are classified into a selected group of the active elements 100 that are in contact with the adhesive layers 14 and a non-selected group of the active elements 100 that are not in contact with the adhesive layers 14. The active elements in the selected group are peeled off from the intermediate transfer substrate 204 so as to be provisionally bonded to the final substrate 11, and the active elements in the non-selected group are left to be held by the intermediate transfer substrate 204. The final substrate 11 is constructed to permit the adhesive layers 14 to be formed in the final substrate 11 in an arrangement corresponding to the arrangement of the active elements 100 in the selected group and to permit the adhesive layers 14 not to be formed in that region on the final substrate 11 which corresponds to the arranging positions of the active elements in the non-selected group.

It is possible to use, for example, an acrylic resin or a polyimide series resin for forming the adhesive layer 14. In the case of using the resin exemplified above, the adhesive layer 14 is not denatured even under a high temperature state of about 200° C. to 300° C. in the process of forming a wiring or the process of forming a passivation film, which are described herein later. Particularly, it is desirable to use an acrylic resin for forming the adhesive layer 14 because the acrylic resin is excellent in adhesivity, transparent, excellent in flexibility, and is unlikely to be cracked. Also, in the case of manufacturing a transmission type liquid crystal display device, use of the acrylic resin for forming the adhesive layer 14 is advantageous in terms of the light efficiency because the acrylic resin exhibits a high transmittance of a visible light. It is possible to disperse fine particles of a metal such as Cr in the adhesive layer 14 or to use a black resist for forming the adhesive layer 14. If the adhesive layer 14 is blackened or rendered opaque, it is possible to suppress the light leakage into the active element transferred onto the adhesive layer 14 so as to improve the switching ratio of the transistor. As a result, the image quality of the display device that is finally formed is improved. If a photosensitive organic resin is used for forming the adhesive layer 14, the organic resin layer can be patterned easily into the adhesive layer 14. Also, in the case of using an organic resin, the manufacturing cost can be lowered, compared with the case of using a resin that is not photosensitive. Of course, in the case of using an organic resin that is not photosensitive, the resin layer can be patterned by means of, for example, etching or printing.

It is possible to form the spacer layers 16 and the adhesive layers 14 in the same process by using the same material, though the spacer layers 16 are formed to have a height larger than that of the adhesive layers 14. As shown in FIG. 5, the spacer layer 16 is formed in a height equal to the sum of the thickness of the adhesive layer 14 and the height of the active element 100 that is to be transferred onto the adhesive layer 14. If the spacer layers 16 and the adhesive layers 14 can be formed simultaneously, the number of process steps is decreased so as to lower the manufacturing cost of the active matrix substrate.

Incidentally, if a fluorination treatment such as a $CF_4$ plasma processing is applied selectively to the surfaces of the spacers 16 after formation of the spacer layers 16 with the region other than the peripheral region 13 masked with, for example, a resist pattern, it is possible to obtain the effect of suppressing the transfer of the active elements 100 onto the spacer layers 16 even if the active elements 100 are brought into contact with the spacer layers 16. Likewise, if a fluorination treatment such as a $CF_4$ plasma processing is applied to the surface of the pixel region 12 after formation of the adhesive layers 14 with the adhesive layers 14 masked with, for example, a resist, the peeling capability is promoted in the region other than the adhesive layers 14 so as to obtain the effect that the active elements 100 are unlikely to be transferred into the non-selected section.

Figure 6:
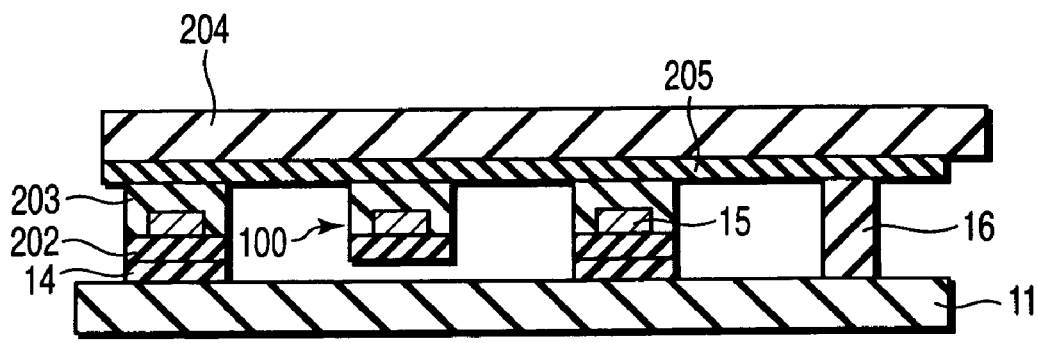
FIG. 6 is a cross sectional view for describing the manufacturing method of the active matrix substrate shown in FIG. 1.

In the next step, the intermediate transfer substrate 204 is aligned with the final substrate 11 such that the active elements 100 that are to be transferred are brought into contact with the adhesive layers 14, followed by bonding the active elements 100 to the adhesive layers 14, as shown in FIG. 6. For performing the bonding, it is possible to use a bonding device including two flat plates that are arranged in parallel or in substantially parallel. In this case, the objects to be bonded are held between the two flat plates so as to permit the objects, which are to be bonded, to be pushed against the two flat plates. It is also possible to use a bonding device including a flat plate and a single roller arranged on the flat plate. In this case, the objects to be bonded are rolled by the roller on the flat plate so as to achieve the desired bonding. Further, it is also possible to achieve the desired bonding by using a contact bonding device formed of two rollers. In the bonding device exemplified above, the objects to be bonded are heated under a pressurized state and, then, cooled to room temperature. In this embodiment of the present invention, the active elements 100 bonded to the adhesive layers 14 are arranged in the pixel region 12, and the spacer layers 16 are formed in the peripheral region 13. As a result, a substantially uniform pressure is applied to the pixel region 12 and the peripheral region 13.

Figure 7:
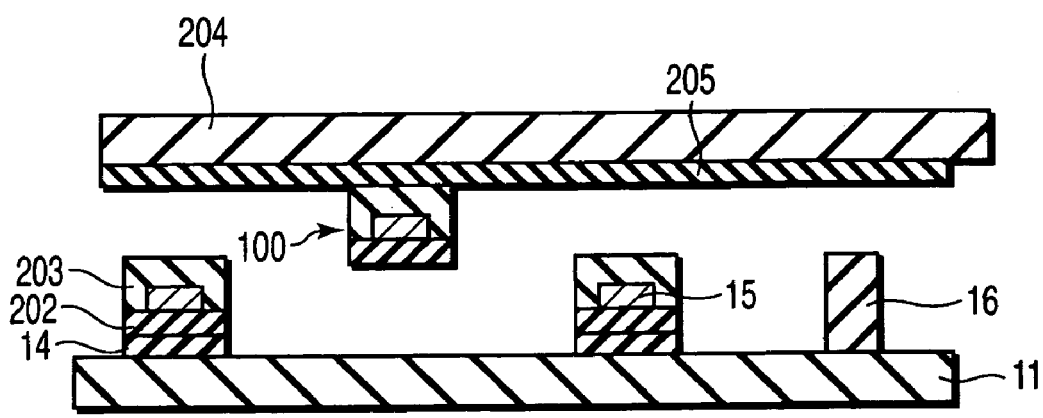
FIG. 7 is a cross sectional view for describing the manufacturing method of the active matrix substrate shown in FIG. 1.

In the next step, the intermediate transfer substrate 204 and the final substrate 11, which are kept bonded, are removed from the bonding device, followed by applying a treatment for promoting the peeling to the peeling layer 205, as shown in FIG. 7. In this embodiment, used is the adhesive peeling layer 205 that can be peeled off by the heating and, thus, a heat treatment is applied to the peeling layer 205 so as to peel off the active element 100 from the peeling layer 205. For example, in the case of using the peeling layer 205 that is peeled off upon irradiation with an ultraviolet light, it suffices to irradiate the peeling layer 205 with an ultraviolet light so as to permit the active element 100 to be peeled off from the peeling layer 205. Particularly, selectivity of the transfer can be improved by applying a heat treatment or an ultraviolet light irradiation to only that region which corresponds to the active element 100 that is to be transferred. By applying the particular peeling treatment, the adhesive force of the peeling layer 205 formed on the intermediate transfer substrate 204 is lowered, and the active element 100 in contact with the adhesive layer 14 is thermally bonded by the contact bonding to the adhesive layer 14, with the result that the active element 100 can be selectively transferred onto the adhesive layer 14. Incidentally, the active matrix substrate 11 shown in FIG. 7 corresponds to the cross section along the line VII—VII shown in FIG. 1.

It is possible to form a plurality of active matrix substrates 11 from a single intermediate transfer substrate 204 having the active elements 100 formed thereon at a high density by repeating the selective transfer process described above a plurality of times. As a result, it is possible to lower the manufacturing cost of the active matrix substrate. It is also possible to form the active matrix substrate 11 sized larger than the intermediate transfer substrate 204 by performing the transfer operation from the intermediate transfer substrate 204 a plurality of times. In other words, it is possible to form an active matrix substrate for a large display device from a small substrate so as to make it possible to miniaturize the manufacturing apparatus of the active elements.

Figure 8:
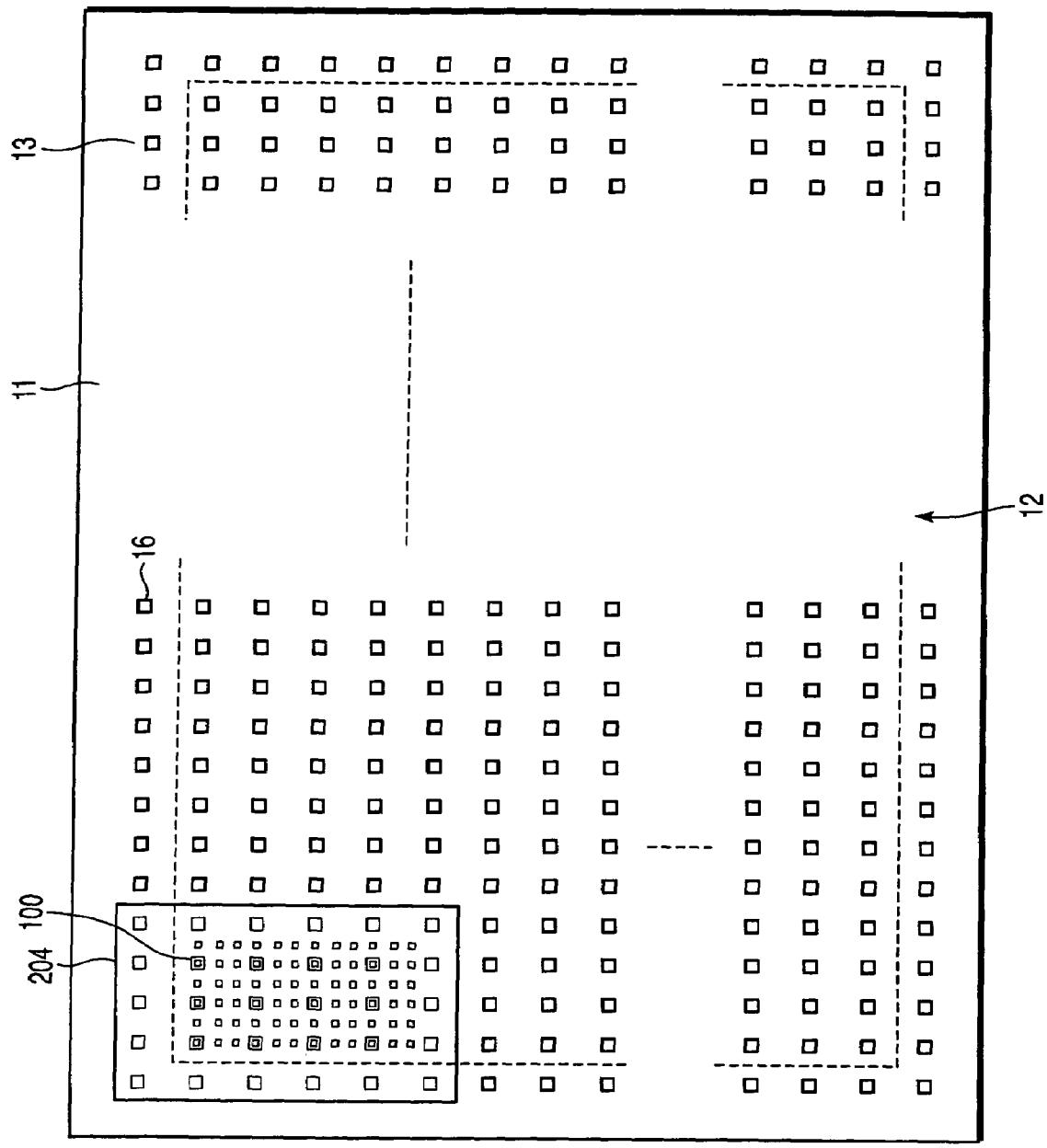
FIG. 8 is a plan view for describing the manufacturing method of the active matrix substrate shown in FIG. 1.
Figure 9:
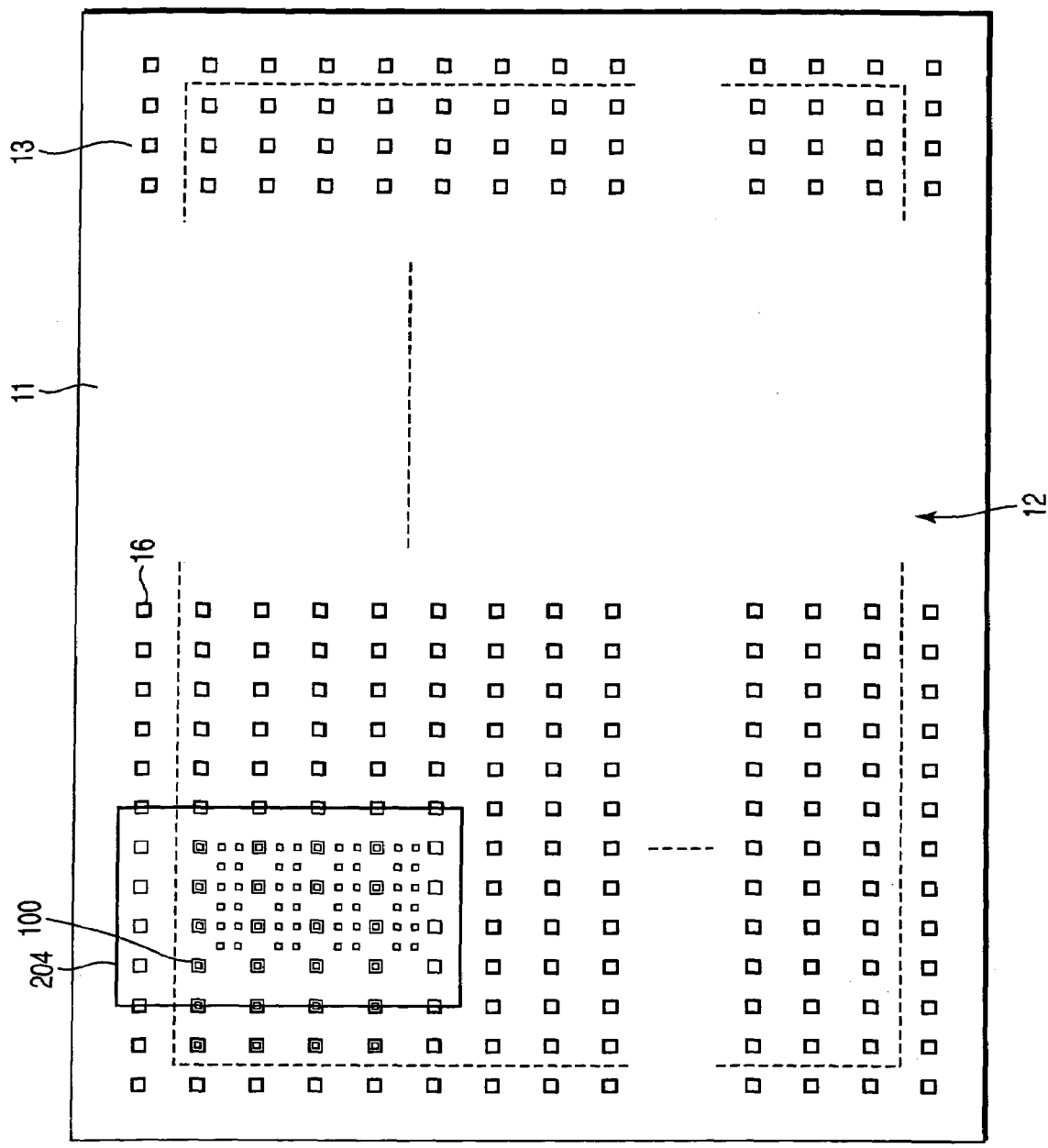
FIG. 9 is a plan view showing the active elements included in the active matrix substrate shown in FIG. 1.

FIGS. 8 and 9 collectively exemplify the case where the active element 100 is transferred from a small intermediate transfer substrate 204 onto a large final substrate 11 by repeating the transfer of the active element 100. As shown in FIG. 8, the active elements 100 are arranged to form a matrix having rows N and columns M in the central region of the intermediate transfer substrate 204. Also, the adhesive layers 16 are arranged at a prescribed pitch in a manner to form rows and columns in the pixel region 12 of the final substrate 11. The pitch of the adhesive layers 16 is set integer number times as large as the pitch of the active elements 100 on the intermediate transfer substrate 204. It follows that, after the active elements 100 are transferred from the intermediate transfer substrate 204 onto the final substrate 11, a prescribed active element 100 can be aligned with the adhesive layer 16 on the final substrate 11 by shifting the intermediate transfer substrate 204 in an amount corresponding to the pitch of the active elements 100 on the intermediate transfer substrate 204.

Also, the intermediate transfer substrate 204 is aligned with the final substrate 11 such that the prescribed active element 100 is allowed to face the adhesive layer 16 in the transfer region, as shown in FIG. 8. In this case, the peripheral portion of the intermediate transfer substrate 204 is allowed to face the spacer 16 of the final substrate 11. If the intermediate transfer substrate 204 is pushed against the final substrate 11 under the particular state, a prescribed active element 100 is pushed against the adhesive layer 16 under the state that the spacer 16 abuts against the peripheral portion of the intermediate transfer substrate 204, with the result that the prescribed active element 100 is transferred onto the final substrate 11. It follows that, in the example shown in FIG. 8, the prescribed active element 100 is transferred onto 3×4 adhesive layers 16.

In the next step, the intermediate transfer substrate 204 is separated from the final substrate 11 and moved by a prescribed distance so as to permit the intermediate transfer substrate 204 to be aligned with the final substrate 11 such that a prescribed active element 100, which is newly selected, is allowed to face a new adhesive layer 16 in the transfer region. In this stage, the peripheral portion of the intermediate transfer substrate 204 is allowed to face the spacer 16 of the final substrate 11 and the active element 100 that has been already transferred. If the intermediate transfer substrate 204 is pushed against the final substrate 11 under this state, a prescribed active element 100, which is newly selected, is pushed against the adhesive layer 16 under the state that the spacer 16 and the prescribed active element 100, which is newly selected, are pushed against the adhesive layer 16. As a result, the prescribed active element 100 is transferred onto the final substrate 11. It follows that the prescribed active element 100 is transferred onto 3×4 adhesive layers 16. The transfer process described above is repeated so as to permit the active element 100 to be transferred onto all of the final substrates 11.

In the example shown in FIGS. 8 and 9, six active elements are arranged to form a row in the intermediate transfer substrate 204. It follows that it is possible to transfer the active element 100 from a single intermediate transfer substrate 204 into the pixel region 12 having an area 6 times as large as the area of the intermediate transfer substrate 204. In the transfer in the edge portion of the screen, it is possible to prevent the defective transfer in the edge portion of the screen by the arrangement that the edge portion of the intermediate transfer substrate 204 overlaps with the spacer layer 16.

Figure 10:
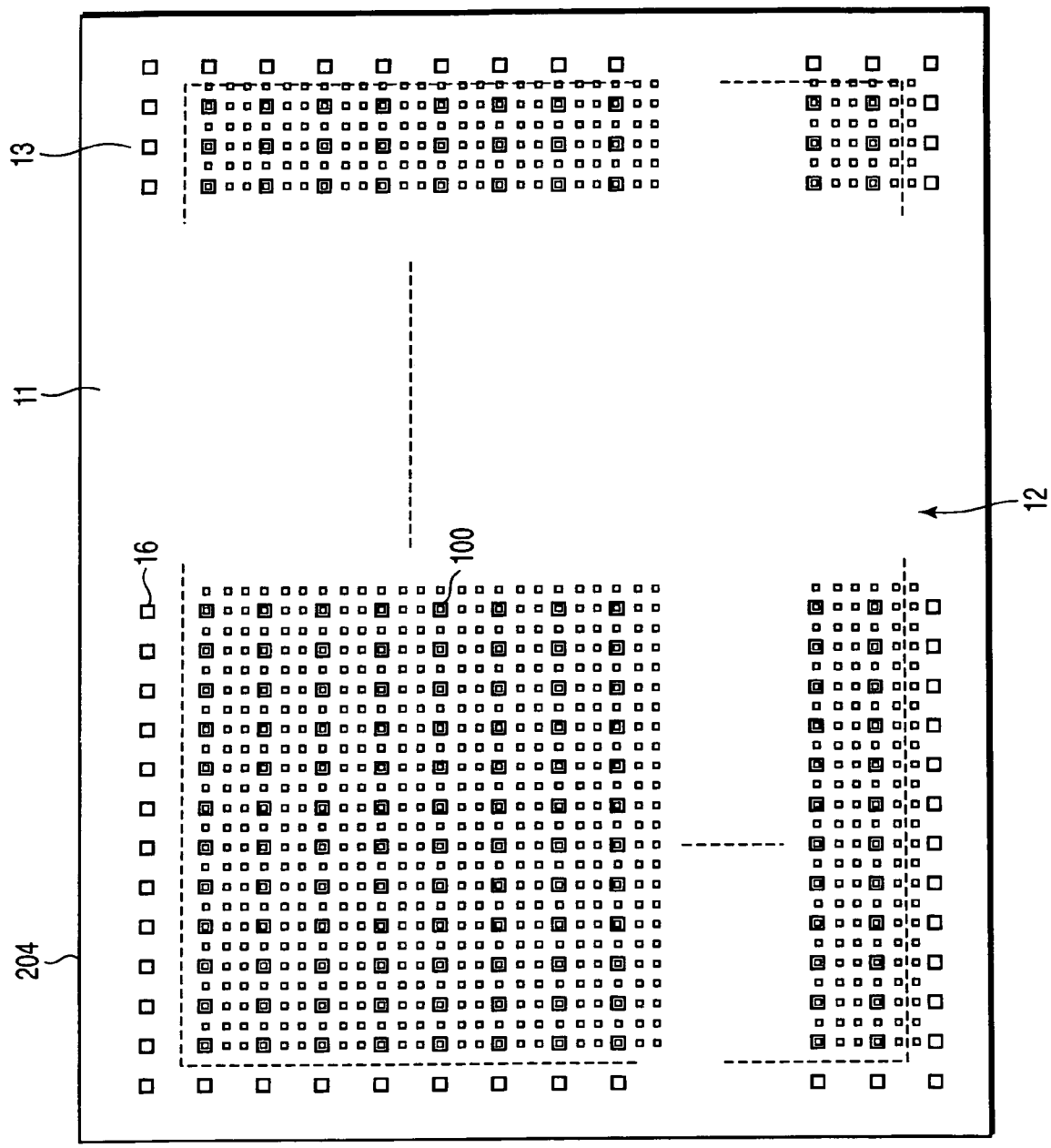
FIG. 10 is a plan view showing the active elements included in the active matrix substrate shown in FIG. 1.

In the example shown in FIGS. 8 and 9, the intermediate transfer substrate 204 is sufficiently smaller than the final substrate 11, and all the active elements 100 can be transferred onto the final substrate 11 by a plurality of transfer operations. However, it is possible for the active element 100 to be transferred from the intermediate transfer substrate 204 onto all the adhesive layers of the final substrate 11 by a single transfer operation, as shown in FIG. 10. To be more specific, the pixel region 12 of the final substrate 11 is substantially equal to the area of the active element-forming region on the intermediate transfer substrate 204 as shown in FIG. 10, and the active element 100 is transferred from the single intermediate transfer substrate 204 onto a single final substrate 11 having a screen region of substantially the same area. Since the active element that is six times as large as the adhesive layer 16 formed in the final substrate 11 is arranged in the intermediate transfer substrate 204, it is possible to transfer the active element from the single intermediate transfer substrate onto the six final substrates each having a screen region substantially equal to the area of the element region.

Figure 11:
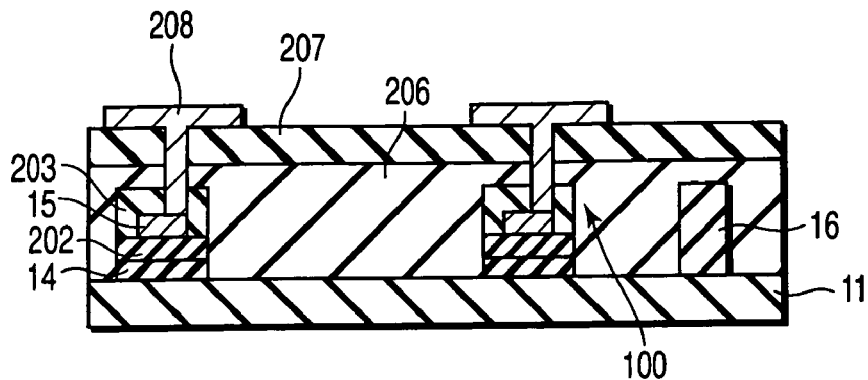
FIG. 11 is a cross sectional view for describing the manufacturing method of the active matrix substrate shown in FIG. 1.

As shown in FIG. 11, an organic film layer made of a photosensitive polyimide is formed as a first flattening layer 206 in a thickness of about 5 to 10 μm on the active matrix substrate 11 having the active element 100 transferred thereonto. Then, the photosensitive polyimide layer is irradiated with an ultraviolet light so as to expose the photosensitive polyimide layer to the ultraviolet light in a prescribed pattern for the etching purpose. By this etching treatment, through-holes are formed on the gate electrode, the source electrode and the drain electrode of the active element 100. After formation of the through-holes, a gate wiring (not shown) is formed by using a metal film such as a Mo film or an Al film, with the result that the gate electrode (not shown) of the thin film transistor is connected to an electrode wiring (not shown) via a gate line extending through the through-hole. Further, a second flattening film 207 made of a photosensitive polyimide is formed in a thickness of about 1 to 2 μm. The second flattening film 207 is irradiated with an ultraviolet light so as to cause the second flattening film 207 to be exposed to the ultraviolet light in a prescribed pattern for the etching purpose. By this etching treatment, through-holes are formed similarly on a source electrode (not shown) and a drain electrode (not shown). Then, a metal film such as an Al film is formed so as to form a signal line (not shown) and a pixel electrode 208. The signal line is connected to the source electrode of the thin film transistor via the through-hole, and the pixel electrode 208 is connected to the drain electrode of the thin film transistor via the through-hole. It follows that, in the structure shown in FIG. 13, the wiring is formed on the flattening film and, thus, the wiring is not broken even if the wiring extends though a region above the spacer layer 16. It should be noted in this connection that, even where the thickness of the flattening film is decreased, it is possible to prevent the breakage of the wiring by allowing at least a part of the wiring to extend through a region in which the spacer layer 16 is not formed.

Finally, prepared is a transparent counter substrate including a counter electrode layer made of a transparent conductive film such as an ITO film (not shown), a black matrix layer (not shown) and a color filter layer (not shown). The counter substrate is bonded to the final substrate with a gap of several microns provided therebetween by using a spacer. The periphery of the bonded structure is sealed with a sealant and, then, a liquid crystal is injected into the clearance between the bonded substrates. It is desirable for the liquid crystal injected into the clearance between the bonded substrates to be a twisted nematic type liquid crystal. However, it is also possible to use another liquid crystal such as a host-gust type liquid crystal, a cholesteric liquid crystal, or a ferroelectric liquid crystal. A liquid crystal display cell having an active element is formed through the processes described above. The gate line, the signal line and the counter electrode are connected to a driving circuit so as to finish the manufacture of a liquid crystal display device.

As described above, the intermediate transfer substrate 204 and the final substrate 11 are held apart from each other by the spacers 16 and, thus, the active element 100 is unlikely to be erroneously transferred into the non-selected portion in the transfer stage of the active element 100 from the intermediate transfer substrate 204 onto the final substrate 11. The particular effect can be obtained because the spacer layers 16 serve to prevent the active element 100 in the non-transfer portion from being brought into contact with the final substrate 11. Also, even if the active element 100 in the non-transfer portion should be in contact with the final substrate 11, the spacer layers 16 permit lowering the contact pressure so as to lower the probability for the active element 100 to be erroneously transferred onto the non-transfer portion.

It should also be noted that, even in the bonding step of the active element 100 to the adhesive layer 14, the contact bonding pressure is concentrated on the adhesive layer 14 through the active element 100 in the pixel region 12 positioned close to the peripheral region 13, with the result that the adhesive layer 14 is collapsed. Also, the problem that the active element 100 itself is collapsed is generated in some cases, and an additional problem is generated that the nonuniformity in the height of the active element 100 from the surface of the final substrate 11 is increased after the transfer operation. In the case of forming the spacer layers 16, however, the distance between the intermediate transfer substrate 204 and the final substrate 11 is maintained constant within a plane during the contact bonding process so as to decrease the nonuniformity in the height of the active element 100 after the transfer operation. It follows that the damage done to the active element 100 can be lowered.

It is desirable for the thickness of the spacer layer 16 to be substantially equal to or larger than the sum of the thickness of the adhesive layer 14 and the thickness of the active element 100. In this case, the defective transfer can be further suppressed.

Figure 12:
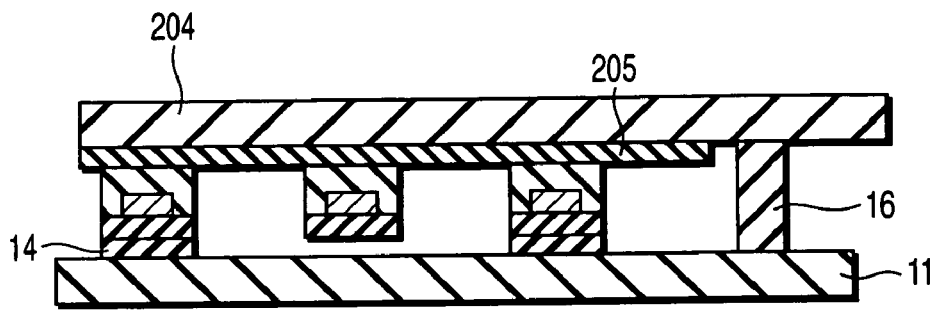
FIG. 12 is a cross sectional view for describing the manufacturing method of the active matrix substrate shown in FIG. 1.

In the embodiment described above, the spacer layers 16 are arranged to face the peeling layer 205 acting as a provisional adhesive layer. However, it is also possible for the spacer layer 16 to be arranged to face the substrate 204, not the peeling layer 205 acting as a provisional adhesive layer, such that the spacer layer 16 is in direct contact with the substrate 204, as shown in FIG. 12. Where the spacer layer 16 is arranged in that region of the substrate 11 which is not positioned to face the peeling layer 205 as shown in FIG. 12, it is desirable for the thickness of the spacer layer 16 to be equal to or larger than the sum of the thickness of the active element 100, the thickness of the adhesive layer 14 and the thickness of the provisional adhesive layer 205.

The construction of the active element 100 according to this embodiment of the present invention will now be described with reference to FIG. 13.

Figure 13:
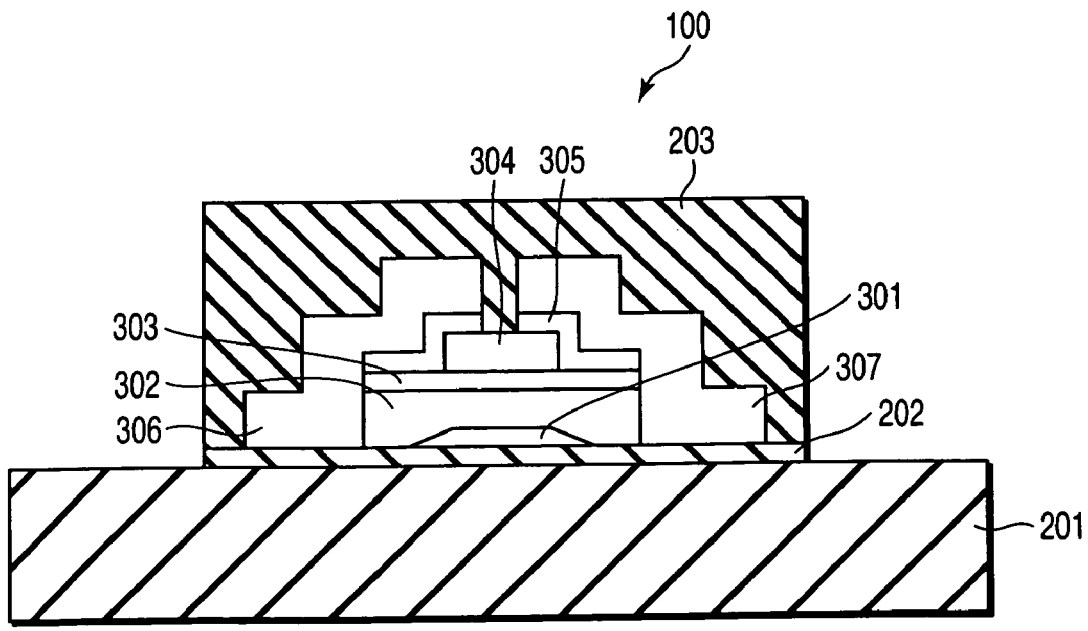
FIG. 13 is a cross sectional view schematically showing the construction of the active matrix element formed on the active matrix substrate shown in FIG. 1.

As shown in FIG. 13, the active element 100 comprises the undercoat layer 202 separated for each of the thin film transistors formed on the element formation substrate 201, a thin film transistor formed on the undercoat layer 202, and the protective layer 203 covering the thin film transistor together with the undercoat layer 202. The thin film transistor comprises a gate electrode 301 patterned on the undercoat layer 202, a gate insulating film 302 covering the gate electrode 301, and a channel layer 303 formed on the gate insulating film 302. Also, a patterned channel protective film 304 is formed on the channel layer 303, and two separated n-type semiconductor layers 305 are formed on the channel protective film 304. Further, a source electrode 306 and a drain electrode 307 are formed to cover, respectively, the two n-type semiconductor layers 305.

The method of manufacturing the active element 100 shown in FIG. 13 will now be described.

In the first step, the undercoat layer 202 is formed in a thickness of about 200 nm to 1 μm on the element formation substrate 201 formed of a glass substrate having a high resistance to heat. It is desirable for the undercoat layer 202 to be formed of, for example, a $SiO_x$ film or a $SiN_x$ film in view of the blocking effect for preventing the ionic impurities from migrating into the thin film transistor. Also, the blocking effect can be further increased in the case of using a laminate structure of, for example, a $SiO_x$ film and a $SiN_x$ film as the undercoat layer 202.

In the next step, a metal such as MoTa or MoW is deposited in a thickness of about 300 nm by, for example, a sputtering method so as to form a metal thin film. The metal thin film thus formed is patterned so as to form the gate electrode 301. Then, the gate insulating film made of, for example, $SiO_x$ or $SiN_x$, the channel layer 303 formed of a semiconductor material such as amorphous silicon, and an insulating film such as a $SiN_x$ film are deposited successively by, for example, a plasma CVD method. The film having a large dielectric constant thus deposited is patterned so as to form the channel protective layer 304. It is desirable to form the gate insulating film 302, the channel layer 303 and the channel protective layer 304 in a thickness of about 100 nm to 400 nm, about 50 nm to 300 nm and about 50 nm to 200 nm, respectively. Incidentally, it is possible for the $SiN_x$ film used as the gate insulating film 302 to be replaced by a film of a material having a large dielectric constant such as a $TaO_x$ film or a PZT film or by a ferroelectric film. The film having a large dielectric constant or the ferroelectric film has a large dielectric constant so as to make it possible to further decrease the thickness of the gate insulating film 302. It follows that it is possible to obtain the effect of lowering the cost for forming the gate insulating film 302. Further, in the case of using a ferroelectric film, the memory-like driving can be achieved so as to lower the driving power.

In the next step, the n-type semiconductor layer 305 doped with phosphorus is formed in a thickness of about 30 nm to 100 nm by, for example, a plasma CVD method in a manner to cover the channel layer 303 and the channel protective layer 304. Then, the laminate structure including the gate insulating film 302 and the n-type semiconductor layer 305 is patterned so as to form an island-shaped pattern. Further, a single layer of, for example, Mo or Al or a laminate structure formed of a Mo layer and an Al layer is formed on the island-shaped pattern by, for example, a sputtering method in a thickness of about 200 nm to 400 nm. Then, the electrode layer and the n-type semiconductor layer 305 are etched by a wet etching method or a dry etching method, with the result that the electrode layer is formed into the source electrode 306 and the drain electrode 306. In this stage, the channel protective layer 304 acts as an etching stopper and, thus, the channel layer 303 does not incur an etching damage.

In the next step, the undercoat layer 202 and the thin film transistor structure describe above are coated with a photo-sensitive polyimide resin and, then, the polyimide resin layer is selectively exposed to an ultraviolet light in a mask pattern so as to form the protective layer 203 in a thickness of about 2 μm to 10 μm. Further, the undercoat layer 202 is etched with the patterned protective film 203 used as a mask. As a result, formed is the active element 100 in which the protective layer 203 covers the individual thin film transistor structures, and the thin film transistor structures are separated from each other.

In the process described above, a thin film transistor is formed on a glass substrate having a high resistance to heat as in the liquid crystal display device widely used nowadays. Such being the situation, it is possible to form the thin film transistor by the high temperature process as in the prior art. It follows that the thin film transistor prepared by the process described above is allowed to exhibit the electric characteristics substantially equal to those of the conventional thin film transistor. Further, since many final substrates are formed on the basis of the element formation substrate having the active elements formed thereon at a high density, the thin film transistors are arranged on the element formation substrate and the intermediate transfer substrate at a pitch finer than that in the final substrate.

Incidentally, in the embodiment described above, a reverse stagger type amorphous silicon TFT is used as the active element. However, it is also possible to use a thin film transistor of another type such as a polysilicon TFT. Also, it is possible to use any element such as a thin film diode or a thin film capacitor as the active element. In the case of manufacturing, for example, an organic EL display device, it is possible to combine a plurality of thin film transistors so as to form the active element.

Incidentally, in this embodiment of the present invention, the pitches 1x(0) and 1y(0) of the adhesive layers 14 in the pixel region 12, the pitches 1x(2) and 1y(2) of the spacer layers 16 in the peripheral region 13, and the distances 1x(1) and 1y(1) between the adhesive layer 14 and the spacer layer 16 are made equal to each other, as shown in FIG. 1. Also, the adhesive layers 14 and the spacer layers 16 are arranged at the same period (1x(0)=1x(1)=1x(2) and 1y(0)=1y(1)=1y(2)). The spacer layers 16 provided by the formed dummy adhesive layers are arranged to form a matrix having two rows in the X-direction and two columns in the Y-direction. For example, even where the spacer layers 16 are formed to have a single row and a single column at the period equal to that of the adhesive layers 14, the spacer layers 16 are effective for suppressing the defective transfer. With increase in the number of spacer layers 16, a ratio of the area of the pixel region to the entire area is lowered. However, the defective transfer within the pixel region 12 tends to be lowered. In order to suppress the defective transfer and to improve the area ratio of the pixel region, it is desirable for the spacer layers 16 to be arranged to form a matrix having about 3 to 4 rows and about 9 to 12 columns in the case of a TFT array in the screen having a diagonal length of 3.2 inches because it is possible in this case to prevent substantially the defective transfer within the screen. The width of the spacer region is about 1.0 mm to 1.5 mm in each of the row direction and the column direction. It is desirable for the ratio of the spacer region to the diagonal length of the screen to be about 1 to 2% because, in this case, it is possible to prevent substantially the defective transfer.

Figure 14:
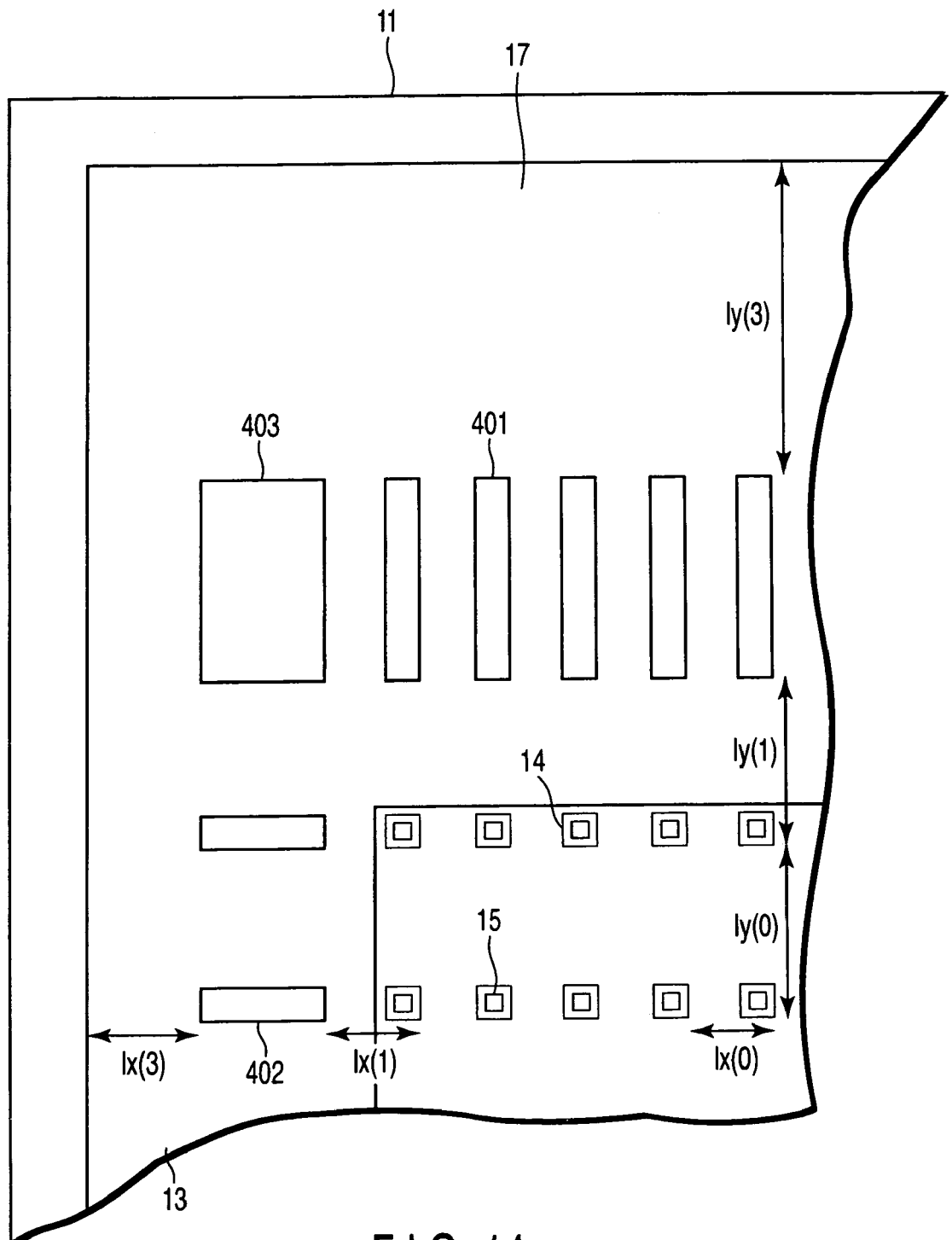
FIG. 14 is a plan view schematically showing the positional relationship between a provisional adhesive layer and a spacer layer in the active matrix substrate according to a modification of the present invention.

Incidentally, it is possible for the pitches $1x(0)$ and $1y(0)$ of the adhesive layers 14 in the pixel region 12, the pitches $1x(2)$ and $1y(2)$ of the spacer layers 16 in the peripheral region 13 and the distances $1x(1)$ and $1y(1)$ between the adhesive layer 14 and the spacer layer 16 not to be equal to each other. It should be noted, however, that, when the active element 100 is transferred from the single intermediate transfer substrate 204 onto a plurality of final substrates 11, it is necessary to satisfy the conditions of $1x(1) \geqq 1x(0)$ and $1y(1) \geqq 1y(0)$ in order to prevent the defective transfer that the active element 100 is brought into contact with the spacer layer 16 so as to be transferred onto the spacer layer 16.

Where the adhesive layers 14 and the spacer layers are not arranged at the same period as described above, it is possible for the spacer layer to be formed like a stripe or to be formed rectangular, as shown in FIG. 14. In FIG. 14, arranged are three kinds of spacer layers including a first spacer layer 401 shaped like a stripe, a second spacer layer 402 shaped like a stripe, and a third spacer layer 403 that is shaped rectangular. If the conditions of $1x(0) \geqq 1x(1)$ and $1y(0) \geqq 1y(1)$ are satisfied in the arrangement shown in FIG. 14, it is possible to prevent the active element 100 from being brought into contact with the spacer layers 401, 402 and 403 even if the active element 100 formed on a single intermediate transfer substrate 204 is transferred onto a plurality of final substrates 11. Where the spacer layers 401, 402 and 403 are shaped like a stripe or formed rectangular, the area occupied by the spacer layers 401, 402 and 403 per unit area is larger than that in the case where the spacer layers are formed in the form of islands as shown in FIG. 1. It follows that the effect of moderating the pressure can be enhanced. Also, since it is possible to allow the wiring to extend through the clearances among the rod-like spacer layers 401, 402, 403, the breakage of the wiring can be prevented. It follows that it is possible to decrease the width of the spacer layer, i.e., the width in a direction perpendicular to the Y-direction in the case of the first spacer 401, or the width in the Y-direction in the case of the second spacer 402. To be more specific, it is possible to prevent the defective transfer of the TFT by setting the width of the spacer layer at about 0.2 mm to 0.7 mm in the TFT array of 3.2 inches. The arrangement shown in FIG. 14 is excellent in its effect of moderating the pressure concentration in the vicinity of the peripheral region and, thus, permits diminishing the regions for forming the spacer layers 401, 402, 403 that are required for bringing about the pressure moderating effect. In the case of arranging stripe-shaped spacer layers, a desired effect can be obtained by only the first spacer layer 401 and the second spacer layer 402. However, the defective transfer can be further suppressed in, particularly, the corner portions each having a high contact pressure by arranging the rectangular or stripe-shaped third spacer layers 403 at the four corners of the screen.

It is desirable for the distance $1y(3)$ between the provisional adhesive layer 17 and the edge of the spacer layer on the intermediate transfer substrate to be set larger than $1y(0)$ as shown in FIG. 14. In this case, the active elements are successively transferred while allowing the intermediate transfer substrate to deviate from the final substrate, and where the transfer is repeated, the spacer layer 16 is brought into contact with the provisional adhesive layer 17. It follows that the defective transfer can be prevented without fail by the spacer layer 16.

Figure 15:
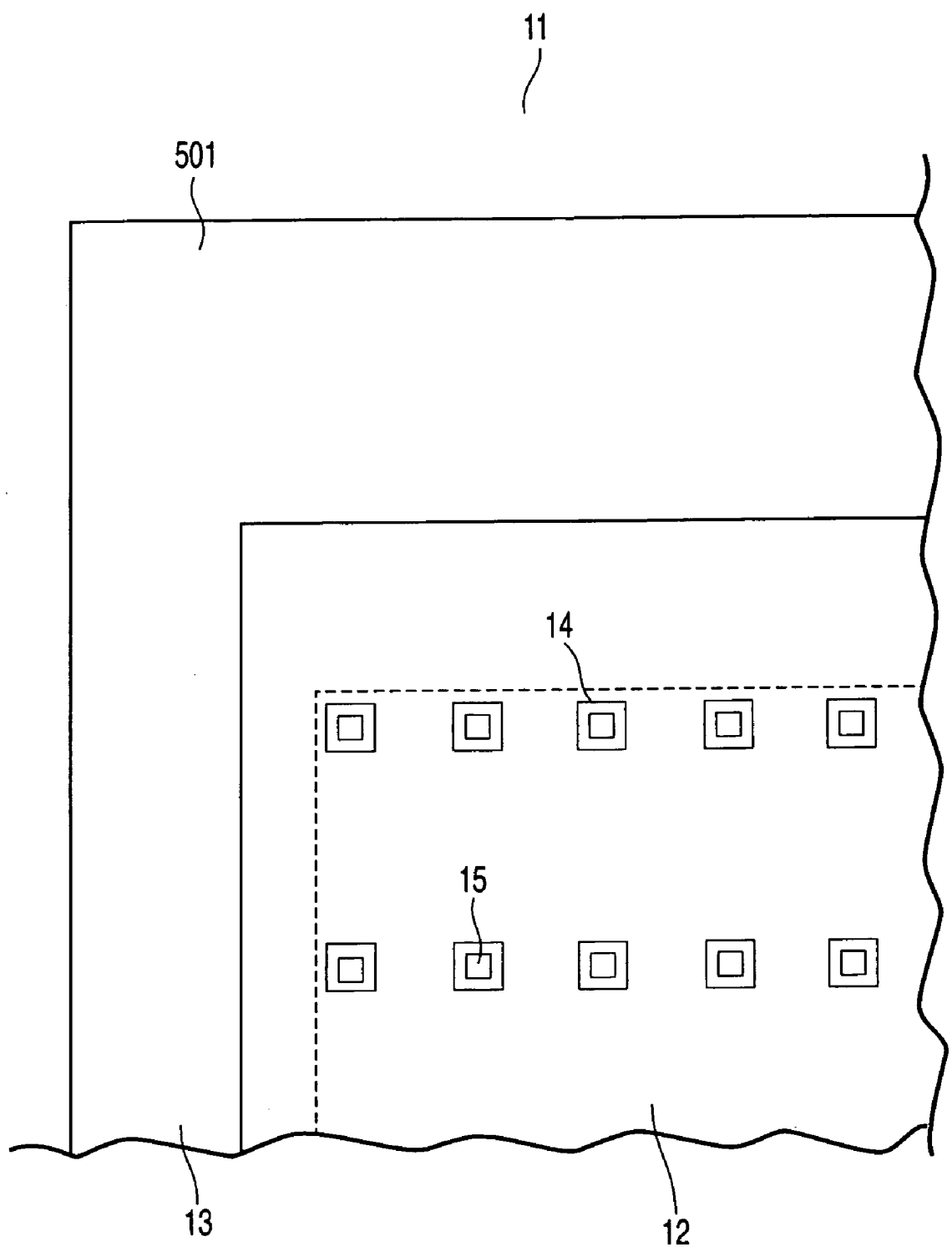
FIG. 15 is a plan view schematically showing the positional relationship between a provisional adhesive layer and a spacer layer in the active matrix substrate according to another modification of the present invention.

Also, FIG. 15 is a plan view showing a final substrate in which a frame-like spacer layer 501 surrounding the entire screen is formed on the substrate 11 in place of the island-shaped spacer layers shown in FIG. 1. In this transfer substrate, the density of the spacer layer 501 is substantially increased so as to make it possible to moderate the pressure applied to the substrate, with the result that it is possible to suppress the defective transfer with a smaller spacer layer area ratio. In the arrangement shown in FIG. 15, it is desirable to arrange the spacer layer 501 in the peripheral region 13 that is positioned as close to the pixel region 12 as possible in view of the various conditions.

FIG. 16 is a plan view schematically showing the relationship between the region in which the adhesive layer 14 is arranged and the region in which the spacer layer 16 is arranged on the surface of the active matrix substrate 11. FIG. 16 shows that, in general, the adhesive layers 14 are arranged at the constant pitches $1x(0)$ and $1y(0)$ on the active matrix substrate 11 as denoted by the broken lines. Where the active elements 100 arranged at a high density on the single intermediate transfer substrate 204 are transferred onto a plurality of final substrates 11, a region 601 in which the spacer layers 16 can be arranged is determined by the position of the edges of the adhesive layers 14 arranged on the periphery no matter how the spacer layer 16 may be shaped. To be more specific, the spacer layers 16 are arranged such that the inner edges of the spacer layers 16 are positioned away from the inner edges of the adhesive layers 14 that are arranged at the outermost circumferential region by the distances of $1x(1)$ and $1y(1)$, and the region 601 in which the spacer layers 16 are arranged is determined to be at the distances $1x(1)$ and $1y(1)$ as denoted by the broken lines. In this case, it is necessary for the relationship of $1x(1) \geqq 1x(0)$ and $1y(1) \geqq 1y(0)$ to be established.

Figure 17:
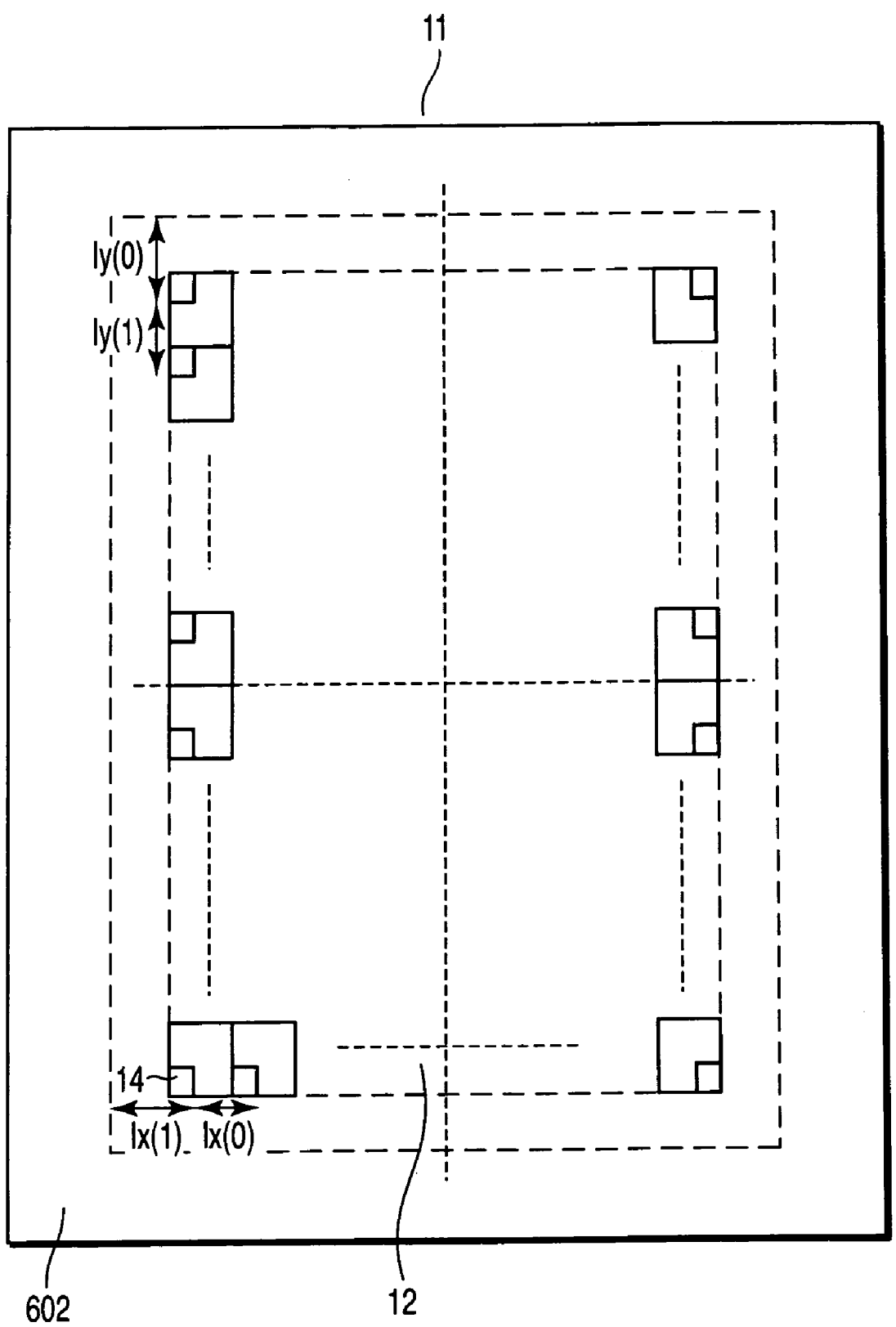
FIG. 17 is a plan view schematically showing the positional relationship between a provisional adhesive layer and a spacer layer in the active matrix substrate according to another modification of the present invention.

The arrangement of the adhesive layers and the spacer layers according to a first modification of the first embodiment of the present invention will now be described with reference to FIG. 17. In the arrangement shown in FIG. 17, the adhesive layers 14 are arranged in symmetry with respect to each of the horizontal and vertical center lines denoted by the broken lines on the surface of the active matrix substrate 11. The size of the intermediate transfer substrate 204 is defined to be ¼ of the size of the pixel region 12 on the active matrix substrate 11 to which the active element 100 is to be transferred. The active elements 100 are arranged on the intermediate transfer substrate 204 at a density not lower than 4 times as high as the density of the active elements 100 arranged on the final substrate 11. An n-number of active elements 100 are arranged on the intermediate transfer substrate 204, and n·¼-number of active elements selected from the n-number of active elements are transferred from the intermediate transfer substrate 204 onto the final substrate 11 by a single transfer operation. Therefore, all of the n-number of active elements 100 is transferred from the intermediate transfer substrate 204 onto the final substrate 11 by performing the transfer operation 4 times. Since the distances $1x(1)$ and $1y(1)$ between a region 602 in which the spacer layers 16 can be arranged and the adhesive layers 14 are defined to be in symmetry in each of the X-direction and the Y-direction with respect to each of the horizontal and vertical center lines, the pressure balance is further improved in the process of bonding the intermediate transfer substrate to the final substrate so as to suppress the nonuniform transfer.

FIG. 18 shows the arrangement of the adhesive layers 14 and the spacer layers 16 according to a second modification of the first embodiment of the present invention. In the arrangement shown in FIG. 18, the adhesive layers 14 in the adjacent columns are arranged deviant from each other by a half pitch ($1y(0)/2$). Similarly, the spacer layers 16 in the adjacent columns are arranged deviant from each other by a half pitch ($1y(2)/2$). It should be noted that the adhesive layers 14 in the even-numbered columns have a period equal to that of the spacer layers 16 in the even-numbered columns. Likewise, the adhesive layers 14 in the odd-numbered columns have a period equal to that of the spacer layers 16 in the odd-numbered columns.

In the transfer according to the prior art, the defective transfer tends to be generated when the distance between the adjacent adhesive layers is short, and the defective transfer tends to be generated such that the active elements positioned between the adjacent adhesive layers are also transferred. It is considered reasonable to understand that the deformation of the peeling layer in the periphery of the region corresponding to the adhesive layer 14 promotes the peeling of the active element arranged between the adjacent adhesive layers. Such being the situation, where the pixel pitch is narrow, the distance between the adjacent adhesive layers 14 can be set long by arranging the adhesive layers 14 deviant from the row and the column, compared with the case where all the adhesive layers 14 are arranged on the row and the column. It is desirable for the spacer layers 16 to be also arranged deviant in accordance with the deviant arrangement of the adhesive layers 14. By this arrangement, it is possible to suppress the defective transfer that tends to be generated around the adhesive layers 14.

In the arrangement shown in FIG. 18, all of the pitches $1x(0)$, $1y(0)$ of the adhesive layers 14 in the pixel region 12, the pitches $1x(2)$, $1y(2)$ of the spacer layers 16 in the peripheral region 13, and the distances $1x(1)$, $1y(1)$ between the adhesive layer 14 and the spacer layer 16 are set equal to each other. However, it is possible for these pitches and the distances not to be equal to each other. It should be noted, however, that, where the active element 100 formed on the single intermediate transfer substrate 204 is transferred onto a plurality of final substrates 11, it is necessary for the conditions of $1x(1) \geqq 1x(0)$ and $1y(1) \geqq 1y(0)$ to be satisfied in order to prevent the defective transfer that the active element 100 is brought into contact with the spacer layer 16 so as to be transferred onto the spacer layer 16. It should also be noted that, in the arrangement shown in FIG. 18, the positions of the adhesive layers and the spacer layers are allowed to deviate by a half period for every row and column. However, the positional deviation noted above is not limited to the particular case noted above. It is possible for the number "m" in the case of the positional deviation by "m-periods" to denote an optional value. Also, it is possible for the value "m" in the row to differ from that in the column. In the sense that the maximum distance is provided between the adjacent adhesive layers, it is desirable to provide the deviation by a half period as shown in FIG. 18. Incidentally, in the arrangement shown in FIG. 18, the columns are allowed to deviate from each other. However, in place of deviation of the column, it is possible to allow the adhesive layers 14 in the adjacent rows to deviate from each other by a half pitch ($1x(0)/2$). Similarly, it is also possible to allow the spacer layers 16 in the adjacent rows to deviate from each other by a half pitch ($1x(2)/2$, $1y(2)/2$) If the distance $1y(3)$ between the edge of the provisional adhesive layer 17 and the edge of the spacer layer in the intermediate transfer substrate is set larger than $1y(0)$, the spacer layer is brought into contact with the provisional adhesive layer 17 without fail when the transfer is successively repeated with the intermediate transfer substrate allowed to deviate from the final substrate. As a result, the effect produced by the arrangement of the spacer layer 16 is increased so as to prevent the defective transfer.

A second embodiment of the present invention will now be described. In the second embodiment, the spacer layers are formed in the periphery of the region of the intermediate transfer substrate to which the active element 100 is bonded. In the following description, those portions alone of the second embodiment which differ from the first embodiment will be described, and the same reference numerals are put to the corresponding portions so as to avoid the overlapping description.

The second embodiment differs from the first embodiment described above in that the spacer layer is not formed in the final substrate and the spacer layer is formed in the intermediate transfer substrate. The manufacturing method of the intermediate transfer substrate and the active matrix substrate for the second embodiment will now be described with reference to FIGS. 19 and 20.

Figure 19:
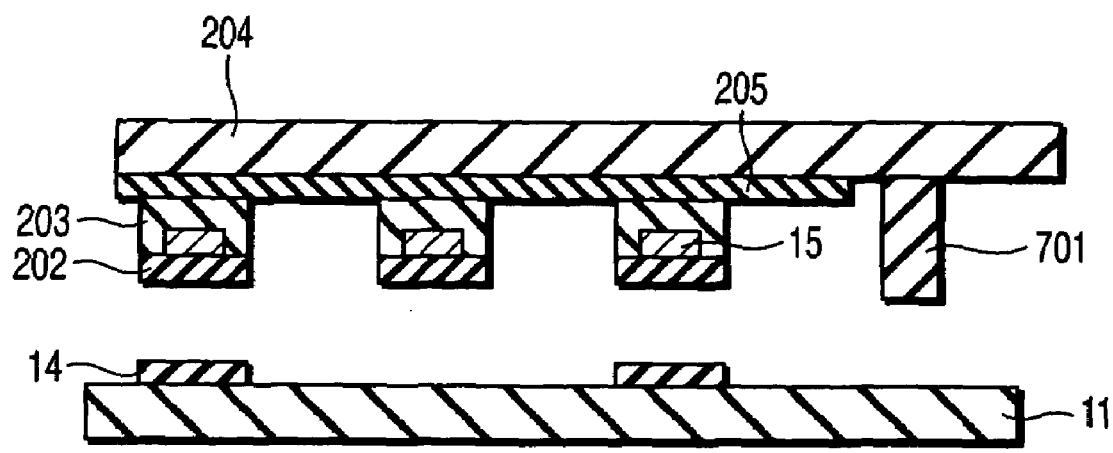
FIG. 19 is a cross sectional view for describing the manufacturing method of an active matrix substrate according to another modification of the present invention.

As shown in FIG. 19, a spacer layer 701 is formed on the intermediate transfer substrate 204. The spacer layer 701 can be formed by, for example, forming first the peeling layer 205 on the intermediate transfer substrate 204, followed by patterning the periphery of the region to which the active element 100 is to be bonded so as to remove the peeling layer 205 and subsequently forming the spacer layer 701 in the portion from which the peeling layer 205 has been removed. In this case, the thickness of the spacer layer 701 is set substantially equal to or larger than the sum of the thickness of the peeling layer 205, the thickness of the active element 100, and the thickness of the adhesive layer. The material and the forming method of the spacer layer 701 are equal to those in the first embodiment. The peeling layer 205 can be patterned by, for example, forming a photo resist on the peeling layer 205 and by applying a sputter etching with, for example, Ar ions to the peeling layer 205 with the photo resist layer used as a mask. The transfer can be achieved by bonding the intermediate transfer substrate 204 having the active elements 100 transferred thereonto to the final substrate having the adhesive layers 14 formed thereon, followed by peeling the intermediate transfer substrate 204, in the second embodiment, too. In this case, the spacer layers are not formed on the final substrate. However, the transfer process itself for the second embodiment is equal to that for the first embodiment described previously. It is possible to obtain the effects similar to those obtained in the first embodiment in the second embodiment, too.

Figure 20:
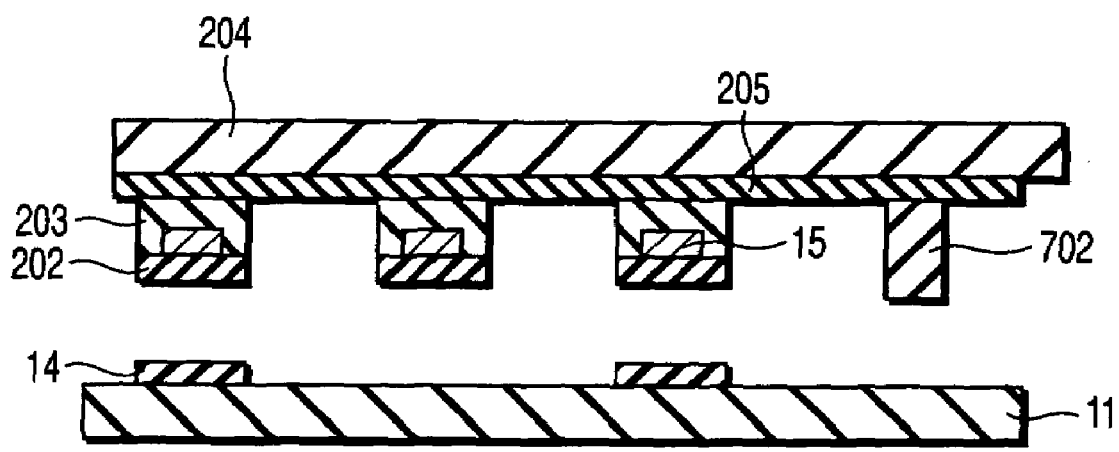
FIG. 20 is a cross sectional view for describing the manufacturing method of an active matrix substrate according to still another modification of the present invention.

In order to improve, particularly, the nonuniform transfer, it is desirable for the thickness of the spacer layer 701 to be substantially equal to or larger than the sum of the thickness of the peeling layer 205, the thickness of the active element 100, and the thickness of the adhesive layer. Also, it is possible to form the spacer layer 702 on the peeling layer 205, as shown in FIG. 20. In this case, the produced effect can be increased by making the thickness of the spacer layer 702 substantially equal to the thickness of the active element 100 and, thus, a desired effect can be obtained by using the spacer layer 702 having a smaller thickness. It should be noted, however, that, in the case of using the peeling layer 205 that can be peeled by, for example, the heating because the spacer layer 702 on the peeling layer 205 is not transferred simultaneously with the active element 100 in the transfer stage, it is desirable for the heat treatment not to be applied to the region in which the spacer layer 702 is formed. Also, in the case of using the peeling layer 205 that can be peeled upon irradiation with an ultraviolet light, the region in which the spacer layer 702 is formed should not be irradiated with the ultraviolet light. Incidentally, it is possible to use in the second embodiment, too, the planar patterns of the spacer layers 701 and 702 similar to those for the spacer layers formed on the final substrate 11 in the first embodiment of the present invention described previously. Where the spacer layers 701 and 702 are formed on the intermediate transfer substrate 204 as in the second embodiment, the spacer layers are not left on the final substrate that is used finally as the active matrix substrate so as to lower the possibility that the wiring formed in the subsequent step is not broken by the stepped portion of the spacer layer. It follows that it is possible to obtain the effect of enhancing the degree of freedom in the pattern of the spacer layer.

As described above, the present invention provides a manufacturing method of an active matrix substrate having a high transfer selectivity, an active matrix substrate that is manufactured by the particular method, and an intermediate transfer substrate used in the manufacturing method of the active matrix substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An active matrix substrate, comprising:
   a substrate having a pixel region and a peripheral region surrounding the pixel region;
   a plurality of adhesive layers arranged in a matrix having rows and columns in the pixel region;
   a plurality of active elements formed on the adhesive layers, respectively; and
   a spacer layer formed in the peripheral region,
   wherein the spacer layer includes a plurality of island-like sections arranged in the peripheral region, the adhesive layers are arranged in the pixel region at a first row pitch and a first column pitch in the row and column directions, and the island-like spacer sections are arranged in the peripheral region at a second row pitch and a second column pitch in the row and column directions, the second row pitch and the second column pitch being set equal to or larger than the first row pitch and the first column pitch.

2. The active matrix substrate according to claim 1, wherein the spacer layer has a thickness equal to or larger than the sum of the thickness of the adhesive layer and thickness of the active element.

3. The active matrix substrate according to claim 1, wherein the spacer layer and the adhesive layer are formed of the same material.

4. The active matrix substrate according to claim 3, wherein each of the spacer layer and the adhesive layer is formed of an acrylic resin.

5. An active matrix substrate, comprising:
   a substrate having a pixel region and a peripheral region surrounding the pixel region;
   a plurality of adhesive layers arranged in a matrix having rows and columns in the pixel region;
   a plurality of active elements formed on the adhesive layers, respectively; and
   a spacer layer formed in the peripheral region,
   wherein the spacer layer includes a plurality of island-like sections arranged in the peripheral region, and the island-like spacer sections and the adhesive layer are arranged on the substrate at a same period.

6. The active matrix substrate according to claim 5, wherein the spacer layer has a thickness equal to or larger than the sum of the thickness of the adhesive layer and thickness of the active element.

7. The active matrix substrate according to claim 5, wherein the spacer layer and the adhesive layer are formed of the same material.

8. The active matrix substrate according to claim 7, wherein each of the spacer layer and the adhesive layer is formed of an acrylic resin.

* * * * *